US 10,990,022 B2

(12) United States Patent
Leshinsky-Altshuller et al.

(10) Patent No.: US 10,990,022 B2
(45) Date of Patent: Apr. 27, 2021

(54) FIELD-TO-FIELD CORRECTIONS USING OVERLAY TARGETS

(71) Applicant: KLA Corporation, Milpitas, CA (US)

(72) Inventors: Enna Leshinsky-Altshuller, Kiryat-Byalik (IL); Inna Tarshish-Shapir, Haifa (IL); Mark Ghinovker, Yoqneam Ilit (IL); Diana Shaphirov, Yoqneam Illit (IL); Guy Ben Dov, Haifa (IL); Roie Volkovich, Hadera (IL); Chris Steely, Nampa, ID (US)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 16/678,840

(22) Filed: Nov. 8, 2019

(65) Prior Publication Data

US 2020/0201193 A1    Jun. 25, 2020

Related U.S. Application Data

(60) Provisional application No. 62/782,594, filed on Dec. 20, 2018.

(51) Int. Cl.
*G03F 7/20* (2006.01)

(52) U.S. Cl.
CPC ........ *G03F 7/70633* (2013.01); *G03F 7/7065* (2013.01); *G03F 7/70141* (2013.01)

(58) Field of Classification Search
CPC ............ G03F 7/70633; G03F 7/70141; G03F 7/70641
USPC ............................................. 355/52, 53, 55
See application file for complete search history.

(56) References Cited

U.S. PATENT DOCUMENTS

| 7,684,038 B1 | 3/2010 | Ghinovker et al. |
| 7,704,652 B2* | 4/2010 | Hatai ............... G03F 7/70633 430/22 |
| 9,087,740 B2 | 7/2015 | Ausschnitt et al. |
| 2003/0223630 A1 | 12/2003 | Adel et al. |
| 2005/0094145 A1 | 5/2005 | Lin |

(Continued)

FOREIGN PATENT DOCUMENTS

KR    100399597 B1    9/2002

OTHER PUBLICATIONS

International Search Report and Written Opinion dated Apr. 29, 2020 for PCT/US2019/067705.

*Primary Examiner* — Hung Nguyen
(74) *Attorney, Agent, or Firm* — Suiter Swantz pc llo

(57) ABSTRACT

A metrology system may include a controller coupled to a metrology tool. The controller may receive a metrology target design including at least a first feature formed by exposing a first exposure field on a sample with a lithography tool, and at least a second feature formed by exposing a second exposure field on the sample with the lithography tool, where the second exposure field overlaps the first exposure field at a location of a metrology target on the sample. The controller may further receive metrology data associated with the metrology target fabricated according to the metrology target design, determine one or more fabrication errors during fabrication of the metrology target based on the metrology data, and generate correctables to adjust one or more fabrication parameters of the lithography tool in one or more subsequent lithography steps based on the one or more fabrication errors.

13 Claims, 18 Drawing Sheets

(56) References Cited

U.S. PATENT DOCUMENTS

2007/0058169 A1   3/2007   Ausschnitt et al.
2016/0313656 A1*  10/2016  Van Dommelen ............................
                                                G03F 7/70641
2017/0235233 A1*  8/2017   Lee ..................... G03F 7/70633
                                                     355/67

* cited by examiner

FIELD-TO-FIELD CORRECTIONS USING OVERLAY TARGETS

CROSS-REFERENCE TO RELATED APPLICATION

The present application claims the benefit under 35 U.S.C. § 119(e) of U.S. Provisional Application Ser. No. 62/782,594, filed Dec. 20, 2018, entitled OVERLAY MARK DESIGN AND ALGORITHMIC APPROACHES FOR IMPROVING OVL MODELED FIELD TERMS AND CORRECTING SCANNER ERRORS, naming Enna Leshinsky-Altshuller, Inna Tarshish-Shapir, Mark Ghinovker, Diana Shaphirov, Guy Ben Dov, Roie Volkovich, and Chris Steely as inventors, which is incorporated herein by reference in the entirety.

TECHNICAL FIELD

The present disclosure relates generally to overlay metrology measurements and, more particularly, to overlay metrology measurements providing field-to-field correctables.

BACKGROUND

Semiconductor fabrication lines typically incorporate metrology measurements at one or more points during a fabrication process to monitor and control the fabrication of features on a particular sample and/or across multiple samples. For example, a typical fabrication process includes fabricating multiple dies distributed across the surface of a sample (e.g., a semiconductor wafer, or the like), where each die includes multiple patterned layers of material forming a device component. Each patterned layer may be formed by a series of steps including material deposition, lithography, and etching to generate a pattern of interest. Further, lithography tools used in the exposure steps (e.g., a scanner, a stepper, or the like) have a field of view substantially smaller than the size of the sample such that each sample layer is exposed with many exposure fields distributed across the sample. It may thus be desirable to monitor and control field-to-field errors associated with the size and placement of exposure fields across the sample to expose each layer as well as overlay errors associated with features on different sample layers within each exposure field, which increases the number of metrology targets on a sample and decreases the fabrication throughput. However, typical metrology systems require separate targets and/or measurement techniques for overlay metrology and field-to-field metrology. It is therefore desirable to provide systems and methods for high-throughput overlay and field-to-field metrology.

SUMMARY

A metrology system is disclosed in accordance with one or more illustrative embodiments of the present disclosure. In one illustrative embodiment, the system includes a controller communicatively coupled to a metrology tool. In another illustrative embodiment, the controller receives a metrology target design including at least a first feature formed by exposing a first exposure field on a sample with a lithography tool and at least a second feature formed by exposing a second exposure field on the sample with the lithography tool. In another illustrative embodiment, the second exposure field partially overlaps the first exposure field and further overlaps the first exposure field at a location of the metrology target on the sample. In another illustrative embodiment, the controller receives metrology data associated with a metrology target fabricated according to the metrology target design. In another illustrative embodiment, the controller determines one or more fabrication errors during fabrication of the metrology target based on the metrology data. In another illustrative embodiment, the controller generates one or more correctables to adjust one or more fabrication parameters of the lithography tool in one or more subsequent lithography steps based on the one or more fabrication errors.

A pattern mask is disclosed in accordance with one or more illustrative embodiments of the present disclosure. In one illustrative embodiment, the pattern mask includes one or more device pattern elements in a device area of the pattern mask. In another illustrative embodiment, the pattern mask includes a first set of metrology pattern elements in a first target area. In another illustrative embodiment, the pattern mask includes a second set of metrology pattern elements in a second target area. In another illustrative embodiment, the first and second target areas are arranged on opposite sides of the device area along a first direction. In another illustrative embodiment, the first and second sets of metrology pattern elements are configured to form at least a portion of a metrology target on a sample when the pattern mask is exposed on the sample with a first exposure field and a second exposure field distributed such that the first target area of the first exposure field and the second target area of the second exposure field overlap on the sample at a location of the metrology target.

A metrology method is disclosed in accordance with one or more illustrative embodiments of the present disclosure. In one illustrative embodiment, the method includes exposing a first exposure field on a sample with a lithography tool to form at least a first feature of a metrology target. In another illustrative embodiment, the method includes exposing a second exposure field on the sample with the lithography tool to form at least a second feature of the metrology target, where the second exposure field partially overlaps the first exposure field, and where the second exposure field overlaps the first exposure field at a location of the metrology target on the sample. In another illustrative embodiment, the method includes generating metrology data associated with the metrology target with a metrology tool. In another illustrative embodiment, the method includes determining one or more fabrication errors during fabrication of the metrology target based on the metrology data. In another illustrative embodiment, the method includes generating one or more correctables to adjust one or more fabrication parameters of the lithography tool in one or more subsequent lithography steps based on the one or more fabrication errors.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Figure 1A:
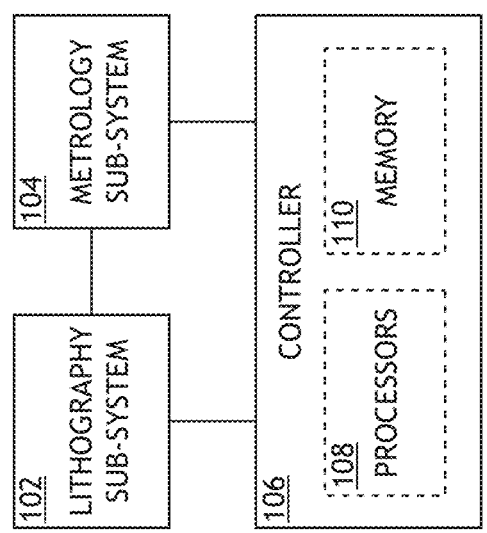
FIG. 1A is a conceptual view illustrating a fabrication system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for providing overlay metrology and field-to-field metrology on a common metrology target (e.g., field-sensitive overlay metrology). Field-sensitive overlay metrology may utilize either new or conventional overlay measurement techniques on field-sensitive overlay targets to provide data indicative of overlay and/or field-to-field errors. For example, the relative positions of features on a field-sensitive overlay metrology target may be sensitive not only to variations between overlapping exposures in a common exposure field as is the case with a typical overlay target, but also to variations between adjacent exposure fields to provide data indicative of field-to-field variations.

For the purposes of the present disclosure, the term overlay metrology broadly refers to measurements of misalignment of features formed through two or more exposures on a common portion of the sample. In this regard, overlay metrology may provide measurements of the alignment of features formed on two or more layers on a sample as well as measurements of the alignment of features formed through successive exposures on a common sample layer (e.g., double patterning, triple patterning, or the like). Further, for the purposes of the present disclosure, the term field-to-field metrology broadly refers to measurements of differences between features formed in two or more exposures in different fields on the sample (e.g., adjacent fields). For example, field-to-field errors may include, but are not limited to, errors in registration or scaling between fields. Accordingly, the systems and methods disclosed herein may provide metrology measurements for a wide range of process errors in a common measurement step.

Some embodiments of the present disclosure are directed to field-sensitive overlay targets suitable for simultaneously providing data indicative of overlay and field-to-field errors. It is recognized herein that typical overlay metrology targets are formed by forming different portions of the target through multiple exposures of the same area of the sample (e.g., the same exposure field of a lithography tool) either on the same layer or different layers. In this regard, the relative positions and/or sizes of features formed in the different exposures are indicative of alignment errors of the lithography tool to the exposure field for the repeated exposures. In contrast, field-sensitive overlay targets may be formed through multiple exposures of a common portion of the sample, where at least one exposure field only partially overlaps one or more other exposure fields used to generate the target. For example, one or more features of the metrology target may be formed from exposing a first field on the sample and one or more features may be formed from exposing a second field on the sample, where the second field only partially overlaps the first field at the location of the metrology target. In this regard, relative positions and/or sizes of features in the field-sensitive overlay target are sensitive to, among other things, field-to-field variations of the various exposure fields used to generate the target.

It is contemplated herein that a field-sensitive overlay target may generally have the same design as any non-field-sensitive overlay target. For example, overlay metrology target designs suitable for adaption include image-based metrology targets such as, but not limited to, advanced imaging metrology (AIM) targets, AIM in-die (AIMid) targets, box-in-box targets, or multi-layer AIMid (MLAIMid) targets. By way of another example, overlay metrology target designs suitable for adaption include scatterometry-based overlay (SCOL) targets. Accordingly, a field-sensitive overlay target may be measured and characterized by any new or existing overlay metrology tool. However, metrology algorithms used to extract information about sources of error associated with measurements of the field-sensitive overlay targets may differ to account for the different sources of error measured by the field-sensitive overlay target.

Additional embodiments of the present disclosure are directed to photomasks suitable for fabricating field-sensitive overlay targets. For example, a photomask may include a device area including patterns associated with device features and one or more target areas surrounding the device area. In particular, target areas on opposite sides of the device area may include complementary portions of a field-sensitive overlay target. In this regard, a full layer of a field-sensitive overlay target may be fabricated by overlapping exposures on the sample (e.g., overlapping exposure fields), where the amount of overlap is designed to generate a complete pattern of the field-sensitive overlay target.

Additional embodiments of the present disclosure are directed to generating correctables for the lithography tool based on both overlay data and field-to-field data generated using field-sensitive overlay targets. For example, feedforward correctables may be provided to the lithography tool during the exposure of subsequent layers to compensate for measured variations on a current layer. By way of another example, feedback correctables may be provided to the lithography tool to mitigate variations (e.g., drifts) over time.

It is further contemplated herein that field-sensitive overlay metrology may be suitable for measuring, controlling, and/or mitigating various sources of fabrication errors including, but not limited to, variations in the shape of the photomask and/or the sample, stresses on the photomask and/or the sample, surface tension effects on the photomask and/or the sample, or errors associated with the lithography tool itself. Accordingly, correctables based on field-sensitive overlay measurements may provide highly accurate and efficient control of the lithography process.

Referring now to FIGS. 1A through 14, systems and methods for field-sensitive overlay metrology are described in greater detail in accordance with one or more embodiments of the present disclosure.

FIG. 1A is a conceptual view illustrating a fabrication system 100, in accordance with one or more embodiments of the present disclosure. In one embodiment, the system 100 includes a lithography sub-system 102 for lithographically imaging one or more pattern elements on a pattern mask (e.g., device pattern elements, metrology target pattern elements, or the like) on a sample. The lithography sub-system 102 may include any lithographic tool known in the art such as, but not limited to, a scanner or stepper. In another embodiment, the system 100 includes a metrology sub-system 104 to characterize one or more features on the sample. The metrology sub-system 104 may include an overlay metrology tool suitable for measuring relative positions of sample features (e.g., features of a field-sensitive overlay target). In one embodiment, the metrology sub-system 104 includes an image-based metrology tool to measure metrology data based on the generation of one or more images of a sample. In another embodiment, the metrology sub-system 104 includes a scatterometry-based metrology system to measure metrology data based on the scattering (reflection, diffraction, diffuse scattering, or the like) of light from the sample. In another embodiment, the system 100 includes a controller 106. In another embodiment, the controller 106 includes one or more processors 108 configured to execute program instructions maintained on a memory medium 110. In this regard, the one or more processors 108 of controller 106 may execute any of the various process steps described throughout the present disclosure.

The one or more processors 108 of a controller 106 may include any processing element known in the art. In this sense, the one or more processors 108 may include any microprocessor-type device configured to execute algorithms and/or instructions. In one embodiment, the one or more processors 108 may consist of a desktop computer, mainframe computer system, workstation, image computer, parallel processor, or any other computer system (e.g., networked computer) configured to execute a program configured to operate the system 100, as described throughout the present disclosure. It is further recognized that the term "processor" may be broadly defined to encompass any device having one or more processing elements, which execute program instructions from a non-transitory memory medium 110. Further, the steps described throughout the present disclosure may be carried out by a single controller 106 or, alternatively, multiple controllers. Additionally, the controller 106 may include one or more controllers housed in a common housing or within multiple housings. In this way, any controller or combination of controllers may be separately packaged as a module suitable for integration into system 100. Further, the controller 106 may analyze data received from the detector 132 and feed the data to additional components within the system 100 (e.g., the lithography sub-system 102) or external to the system 100.

The memory medium 110 may include any storage medium known in the art suitable for storing program instructions executable by the associated one or more processors 108. For example, the memory medium 110 may include a non-transitory memory medium. By way of another example, the memory medium 110 may include, but is not limited to, a read-only memory, a random-access memory, a magnetic or optical memory device (e.g., disk), a magnetic tape, a solid-state drive and the like. It is further noted that memory medium 110 may be housed in a common controller housing with the one or more processors 108. In one embodiment, the memory medium 110 may be located remotely with respect to the physical location of the one or more processors 108 and controller 106. For instance, the one or more processors 108 of controller 106 may access a remote memory (e.g., server), accessible through a network (e.g., internet, intranet and the like). Therefore, the above description should not be interpreted as a limitation on the present invention but merely an illustration.

Figure 1B:
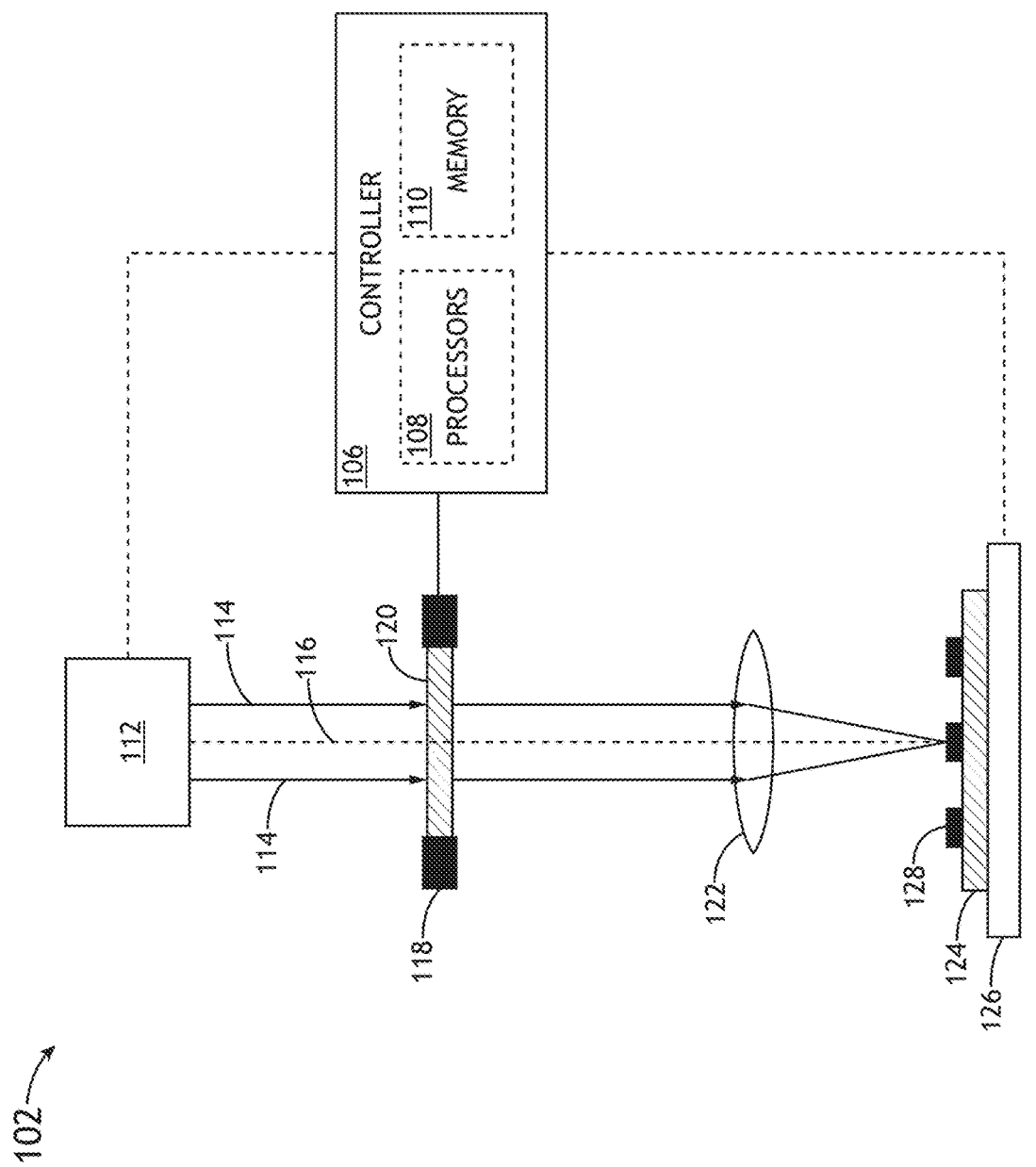
FIG. 1B is a conceptual view illustrating the lithography sub-system, in accordance with one or more embodiments of the present disclosure.

FIG. 1B is a conceptual view illustrating the lithography sub-system 102, in accordance with one or more embodiments of the present disclosure. In one embodiment, the lithography sub-system 102 includes a lithography illumination source 112 configured to generate an illumination beam 114. The one or more illumination beams 114 may include one or more selected wavelengths of light including, but not limited to, ultraviolet (UV) radiation, visible radiation, or infrared (IR) radiation.

Illumination from the lithography illumination source 112 may have any spatial distribution (e.g., illumination pattern). For example, the lithography illumination source 112 may include, but is not limited to, a single-pole illumination source, a dipole illumination source, a C-Quad illumination source, a Quasar illumination source, or a free-form illumination source. In this regard, the lithography illumination source 112 may generate on-axis illumination beams 114 in which illumination propagates along (or parallel to) an optical axis 116 and/or any number of off-axis illumination beams 114 in which illumination propagates at an angle to the optical axis 116.

It is further noted herein that, for the purposes of the present disclosure, an illumination pole of the lithography illumination source 112 may represent illumination from a specific location. In this regard, each spatial location of the lithography illumination source 112 (e.g., with respect to the optical axis 116) may be considered an illumination pole. Further, an illumination pole may have any shape or size known in the art. Additionally, the lithography illumination source 112 may be considered to have an illumination profile corresponding to a distribution of illumination poles.

Further, the lithography illumination source 112 may generate the illumination beams 114 by any method known in the art. For an example, an illumination beam 114 may be formed as illumination from an illumination pole of the lithography illumination source 112 (e.g., a portion of an illumination profile of a lithography illumination source 112, or the like). By way of another example, lithography illumination source 112 may include multiple illumination sources for the generation of multiple illumination beams 114.

In another embodiment, the lithography sub-system 102 includes a mask support device 118. The mask support device 118 is configured to secure a pattern mask 120. In another embodiment, the lithography sub-system 102 includes a set of projection optics 122 configured to project an image of the pattern mask 120 illuminated by the one or more illumination beams 114 onto a sample 124 disposed on a sample stage 126 in order to generate printed pattern elements corresponding to the image of the pattern mask 120. In another embodiment, the mask support device 118 may be configured to actuate or position the pattern mask 120. For example, the mask support device 118 may actuate the pattern mask 120 to a selected position with respect to the projection optics 122 of the system 100.

The sample 124 may include any number of photosensitive materials and/or material layers suitable for receiving the image of the pattern mask 120. For example, the sample 124 may include a resist layer 128. In this regard, the set of projection optics 122 may project an image of the pattern mask 120 onto the resist layer 128 to expose the resist layer 128 and a subsequent etching step may remove the exposed material (e.g., positive etching) or the unexposed material (e.g., negative etching) in order to provide printed features on the sample 124. Further, the pattern mask 120 may be utilized in any imaging configuration known in the art. For example, the pattern mask 120 may be a positive mask (e.g., a bright-field mask) in which pattern elements are positively imaged as printed pattern elements. By way of another example, the pattern mask 120 may be a negative mask (e.g., a dark-field mask) in which pattern elements of the pattern mask 120 form negative printed pattern elements (e.g., gaps, spaces, or the like).

The controller 106 may be communicatively coupled to any element or combination of elements in the lithography sub-system 102 such as, but not limited to, the mask support device 118 and/or the sample stage 126 to direct the transfer of pattern elements on a pattern mask 120 to a sample 124, or the lithography illumination source 112 to control one or more characteristics of the illumination beam 114.

Figure 1C:
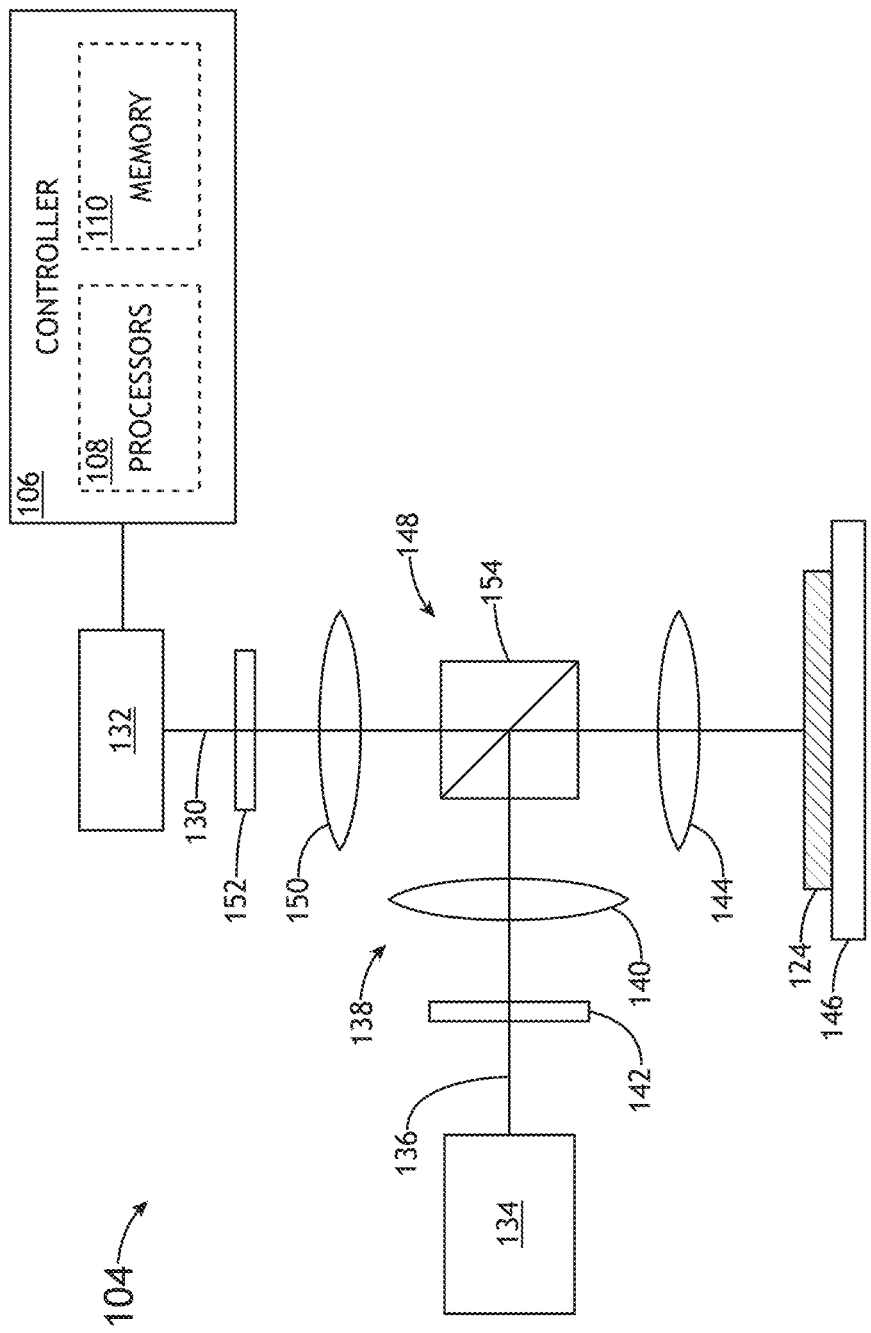
FIG. 1C is a block diagram view of the metrology sub-system, in accordance with one or more embodiments of the present disclosure.

FIG. 1C is a block diagram view of the metrology sub-system 104, in accordance with one or more embodiments of the present disclosure. The system 100 may generate one or more images associated with light emanating from the sample 124 (e.g., sample light 130) on at least one detector 132 using any method known in the art. In one embodiment, the detector 132 is located at a field plane to generate an image of one or more features on the sample 124. In this regard, the system 100 may operate as an image-based overlay metrology tool. In another embodiment, the detector 132 is located at a pupil plane to generate an image based on angles of light emanating from the sample 124 (e.g., based on reflection, diffraction, scattering, or the like). In this regard, the system 100 may operate as a scatterometry-based metrology tool.

In one embodiment, the metrology sub-system 104 includes a metrology illumination source 134 to generate a metrology illumination beam 136. The metrology illumination source 134 may be the same as the lithography illumination source 112 or may be a separate illumination source configured to generate a separate metrology illumination beam 136. The metrology illumination beam 136 may include one or more selected wavelengths of light including, but not limited to, vacuum ultraviolet (VUV) radiation, deep ultraviolet (DUV) radiation, ultraviolet (UV) radiation, visible radiation, or infrared (IR) radiation. The metrology illumination source 134 may further generate a metrology illumination beam 136 including any range of selected wavelengths. In another embodiment, the metrology illumination source 134 may include a spectrally-tunable illumination source to generate a metrology illumination beam 136 having a tunable spectrum.

The metrology illumination source 134 may further produce a metrology illumination beam 136 having any temporal profile. For example, the metrology illumination source 134 may produce a continuous metrology illumination beam 136, a pulsed metrology illumination beam 136, or a modulated metrology illumination beam 136. Additionally, the metrology illumination beam 136 may be delivered from the metrology illumination source 134 via free-space propagation or guided light (e.g., an optical fiber, a light pipe, or the like).

In another embodiment, the metrology illumination source 134 directs the metrology illumination beam 136 to the sample 124 via an illumination pathway 138. The illumination pathway 138 may include one or more lenses 140 or additional illumination optical components 142 suitable for modifying and/or conditioning the metrology illumination beam 136. For example, the one or more illumination optical components 142 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 142 may include aperture stops to control the angle of illumination on the sample 124 and/or field stops to control the spatial extent of illumination on the sample 124. In one instance, the illumination pathway 138 includes an aperture stop located at a plane conjugate to the back focal plane of an objective lens 144 to provide telecentric illumination of the sample. In another embodiment, the system 100 includes an objective lens 144 to focus the metrology illumination beam 136 onto the sample 124.

In another embodiment, the sample 124 is disposed on a sample stage 146. The sample stage 146 may include any device suitable for positioning the sample 124 within the system 100. For example, the sample stage 146 may include any combination of linear translation stages, rotational stages, tip/tilt stages, or the like.

In another embodiment, a detector 132 is configured to capture radiation emanating from the sample 124 (e.g., sample light 130) through a collection pathway 148. For example, the collection pathway 148 may include, but is not required to include, a collection lens (e.g., the objective lens 144 as illustrated in FIG. 1C) or one or more additional collection pathway lenses 150. In this regard, a detector 132 may receive radiation reflected or scattered (e.g., via specular reflection, diffuse reflection, and the like) from the sample 124 or generated by the sample 124 (e.g., luminescence associated with absorption of the metrology illumination beam 136, or the like).

The collection pathway 148 may further include any number of collection optical components 152 to direct and/or modify illumination collected by the objective lens 144 including, but not limited to, one or more collection pathway lenses 150, one or more filters, one or more polarizers, or one or more beam blocks. Additionally, the collection pathway 148 may include field stops to control the spatial extent of the sample imaged onto the detector 132 or aperture stops to control the angular extent of illumination from the sample used to generate an image on the detector 132. In another embodiment, the collection pathway 148 includes an aperture stop located in a plane conjugate to the back focal plane of an optical element of the objective lens 144 to provide telecentric imaging of the sample.

The detector 132 may include any type of optical detector known in the art suitable for measuring illumination received from the sample 124. For example, a detector 132 may include a sensor suitable for generating one or more images of a static sample 124 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. By way of another example, a detector 132 may include a sensor suitable for generating one or more images of a sample 124 in motion (e.g., a scanning mode of operation) such as, but not limited to, a line sensor or a time delay and integration (TDI) sensor.

In another embodiment, a detector 132 may include a spectroscopic detector suitable for identifying wavelengths of radiation emanating from the sample 124. In another embodiment, the system 100 may include multiple detectors 132 (e.g., associated with multiple beam paths generated by one or more beamsplitters) to facilitate multiple metrology measurements by the system 100.

In one embodiment, as illustrated in FIG. 1C, the system 100 includes a beamsplitter 154 oriented such that the objective lens 144 may simultaneously direct the metrology illumination beam 136 to the sample 124 and collect radiation emanating from the sample 124. In this regard, the system 100 may be configured in an epi-illumination mode.

In another embodiment, the controller 106 is communicatively coupled to one or more elements of the system 100. In this regard, the controller 106 may transmit and/or receive data from any component of the system 100. For example, the controller 106 may be configured to receive data including, but not limited to, one or more images from the detector 132.

Figure 2:
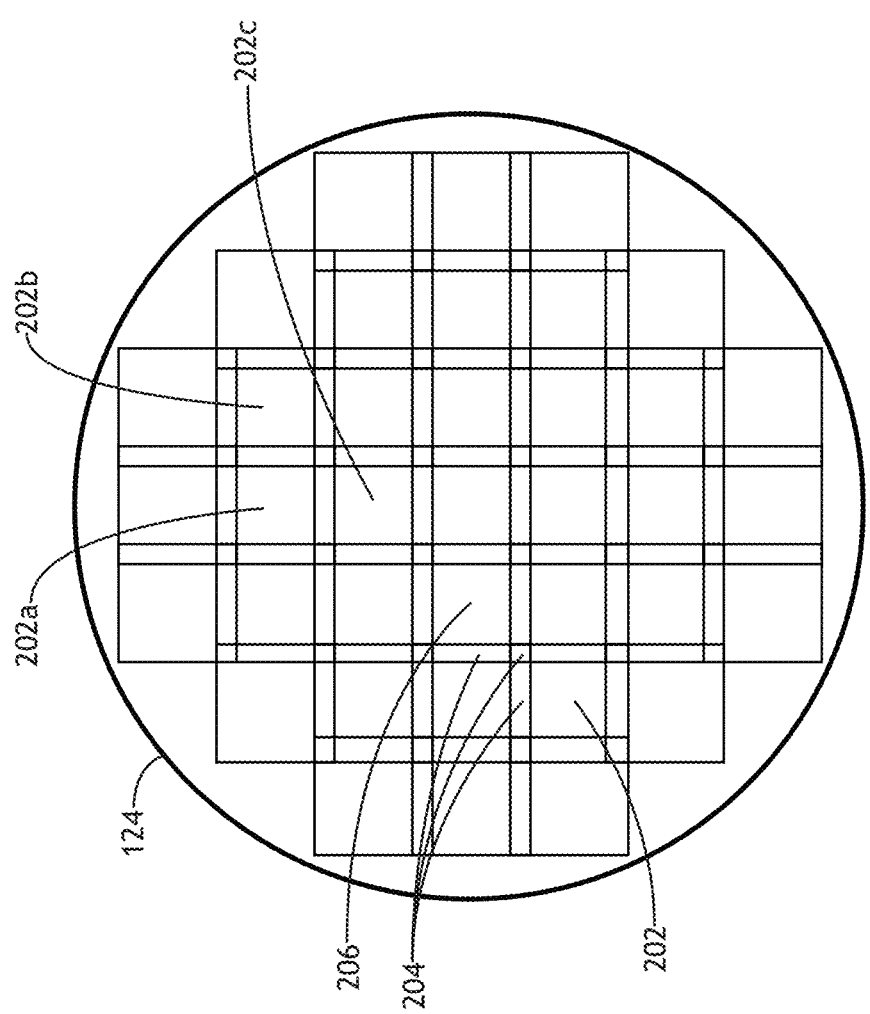
FIG. 2 is a conceptual top view of a sample illustrating a multitude of overlapping exposure fields associated with multiple lithography steps by the lithography sub-system associated with fabrication of a particular sample layer, in accordance with one or more embodiments of the present disclosure.

FIG. 2 is a conceptual top view of a sample 124 illustrating a multitude of overlapping exposure fields 202 associated with multiple lithography steps by the lithography sub-system 102 associated with fabrication of a particular sample layer, in accordance with one or more embodiments of the present disclosure. In one embodiment, a pattern mask 120 is imaged onto each exposure field 202. Further, the same pattern mask 120 may be repeatedly imaged onto each exposure field 202 or multiple pattern masks 120 may be imaged onto selected exposure fields 202. It is to be understood, however, that FIG. 2 is not drawn to scale. Rather, parameters in FIG. 2 such as, but not limited to, the size of each exposure field 202 relative to the size of the sample 124, the number of exposure fields 202, or the amount of overlap between adjacent exposure fields 202 are selected for illustrative purposes and should not be interpreted as limiting.

In one embodiment, as illustrated in FIG. 2, adjacent exposure fields 202 may overlap to form overlap regions 204 distributed across the sample 124. Device features (e.g., associated with dies distributed across the sample 124) may be fabricated in any of the non-overlap regions 206, whereas field-sensitive overlay targets, or portions thereof on a particular sample layer, may be formed in any of the overlap regions 204 based on exposures from adjacent, overlapping exposure fields 202. In contrast, it is recognized herein that typical overlay metrology targets may be formed using fully-overlapping exposure fields 202 associated with different lithography steps either on the same layer or on different layers.

In another embodiment, the pattern of exposure fields 202 may be replicated for multiple lithography steps associated in a fabrication process. For example, a first set of pattern elements associated with a first sample layer may be fabricated using a series of material deposition steps, lithography steps using a pattern of exposure fields 202 (e.g., as illustrated in FIG. 2), etching steps, and the like. A second set of pattern elements associated with a second sample layer may be fabricated using an additional series of material deposition steps, lithography steps using a pattern of exposure fields 202, etching steps, and the like, where the pattern of exposure fields 202 associated with the first and second sample layers are aligned. A similar process may be carried out for multiple aligned exposures on a single sample layer (e.g., for a double-patterning process, or the like).

Figure 8A:
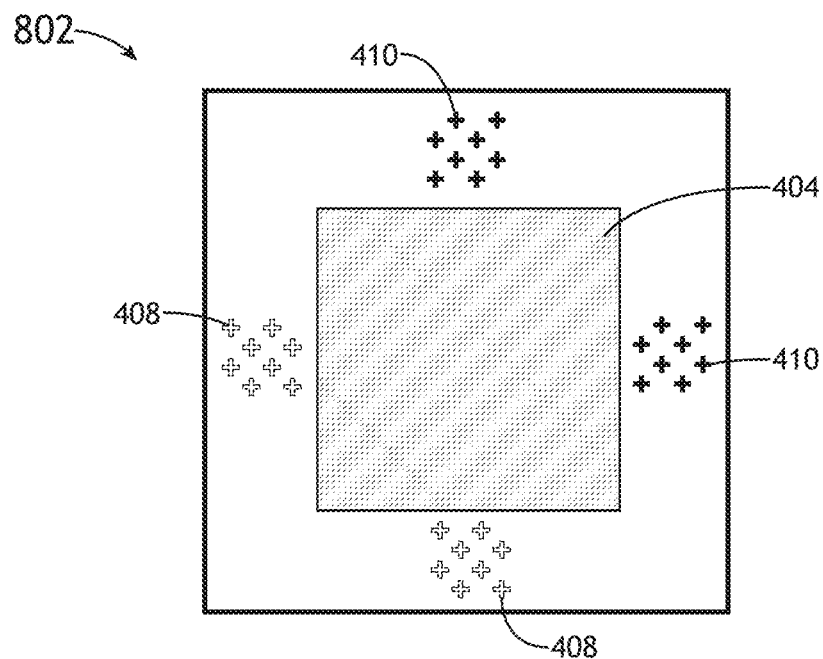
FIG. 8A is a top view of a pattern mask suitable for forming an AIMid design of the field-sensitive overlay target illustrated in FIG. 3 in which the first-layer target features and the second-layer target features are interleaved, in accordance with one or more embodiments of the present disclosure.
Figure 8B:
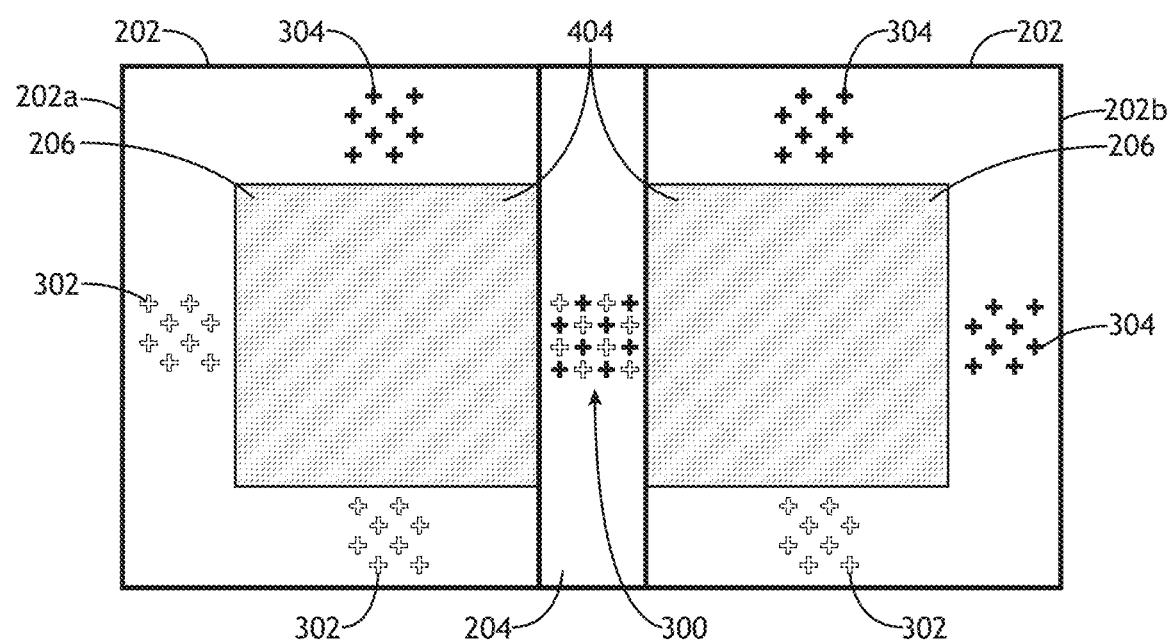
FIG. 8B is a top view of a portion of the sample illustrating the fabrication of the field-sensitive overlay targets based on the pattern mask in FIG. 8A with partially-overlapping exposure fields, in accordance with one or more embodiments of the present disclosure.
Figure 9A:
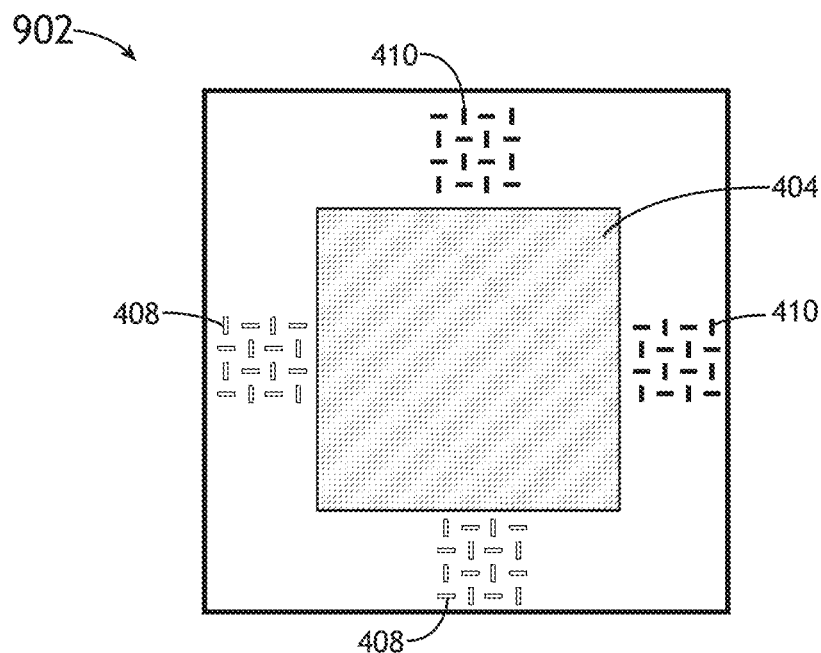
FIG. 9A is a top view of a pattern mask suitable for forming an AIMid design of the field-sensitive overlay target illustrated in FIG. 3 in which the first-layer target features and the second-layer target features overlap to form cross patterns, in accordance with one or more embodiments of the present disclosure.
Figure 9B:
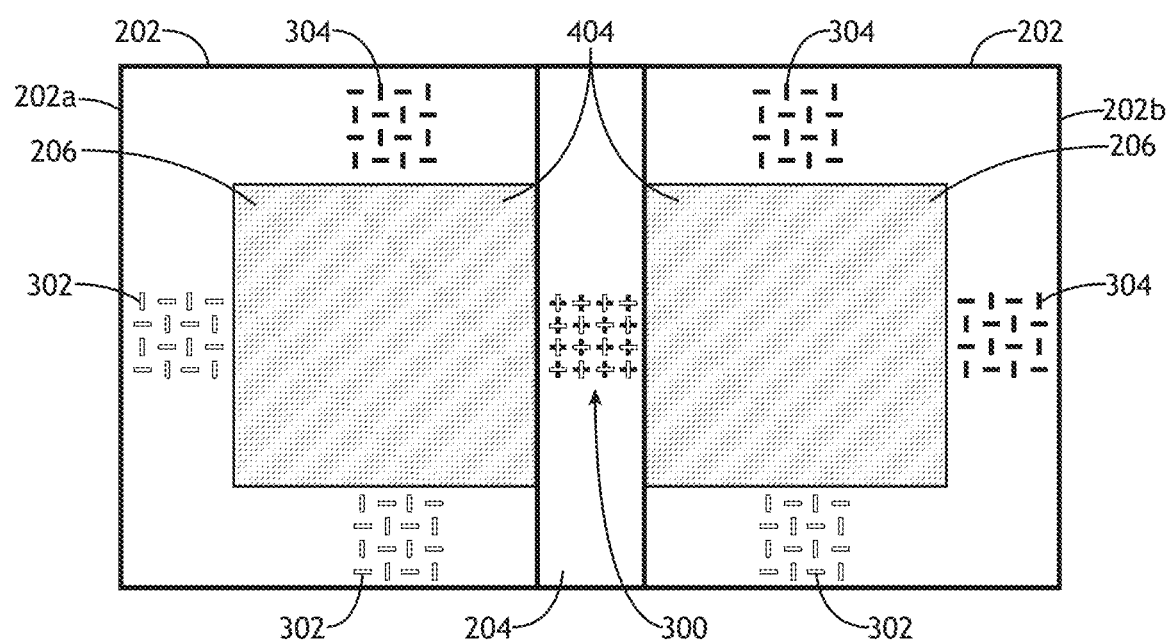
FIG. 9B is a top view of a portion of the sample illustrating the fabrication of the field-sensitive overlay targets based on the pattern mask in FIG. 9A with partially-overlapping exposure fields, in accordance with one or more embodiments of the present disclosure.
Figure 10:
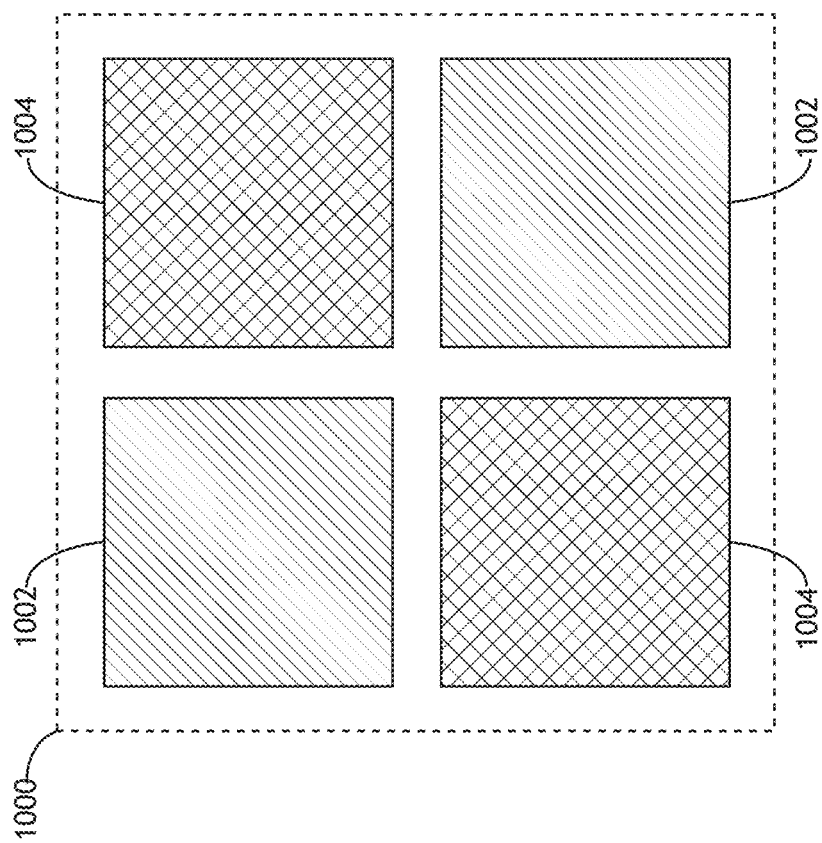
FIG. 10 is a conceptual top view of a single-layer field-sensitive overlay target, in accordance with one or more embodiments of the present disclosure.
Figure 11A:
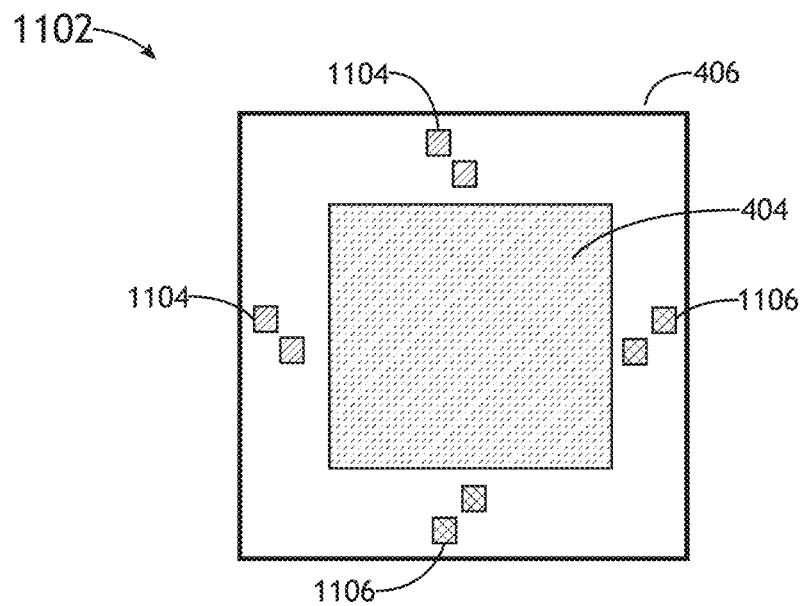
FIG. 11A is a top view of a pattern mask suitable for forming the field-sensitive overlay target illustrated in FIG. 10, in accordance with one or more embodiments of the present disclosure.
Figure 11B:
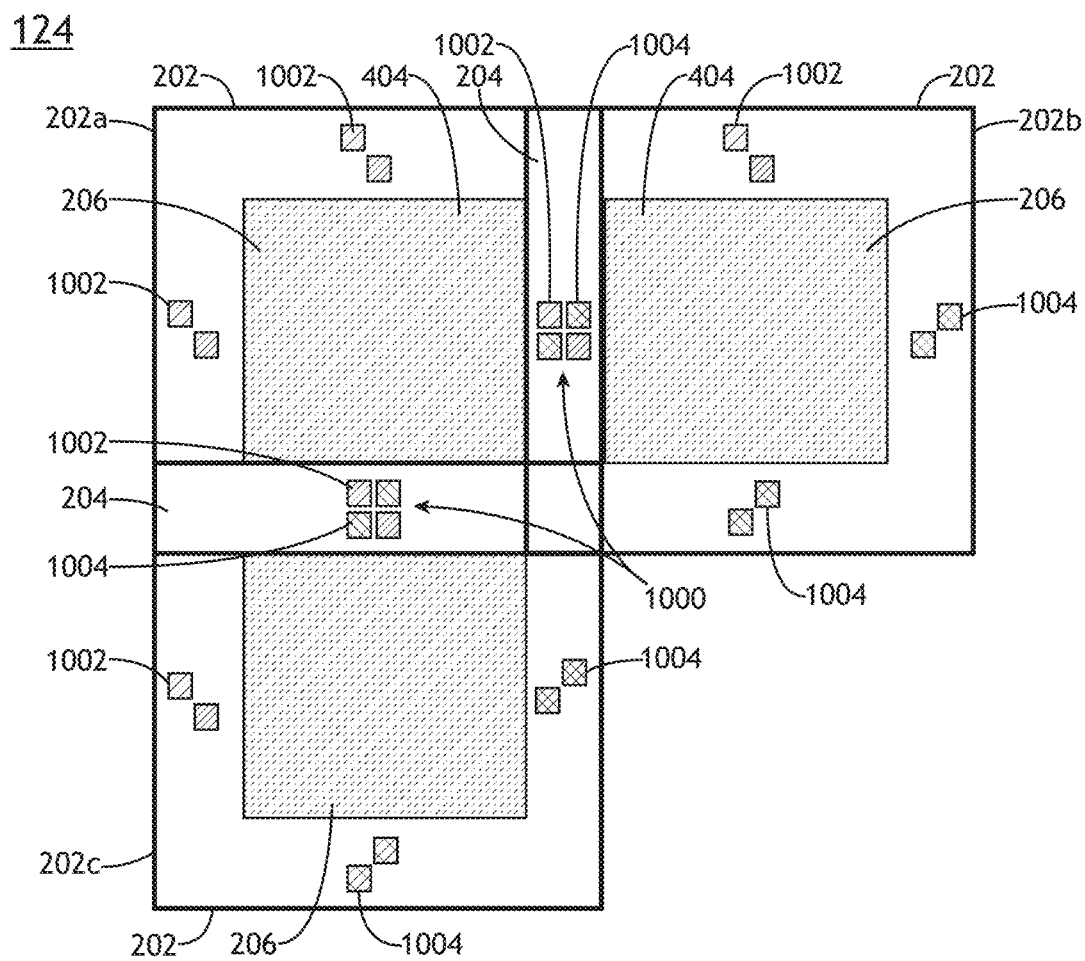
FIG. 11B is a top view of a portion of the sample illustrating the fabrication of the field-sensitive overlay targets based on the pattern mask in FIG. 11A along two orthogonal directions with partially-overlapping exposure fields, in accordance with one or more embodiments of the present disclosure.
Figure 12:
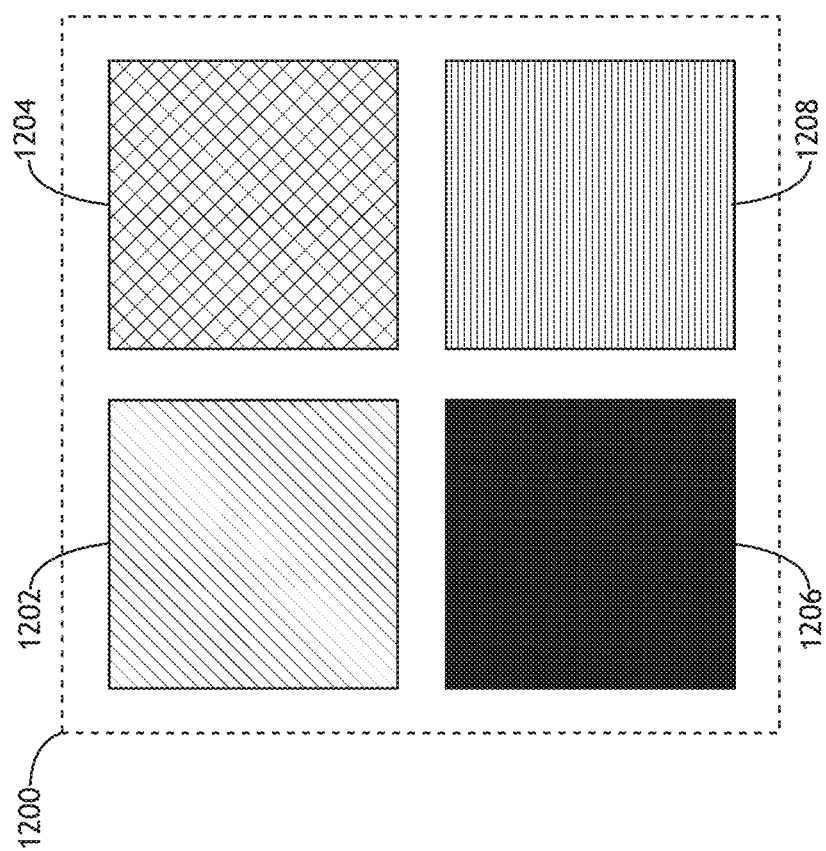
FIG. 12 is a conceptual top view of a single-layer field-sensitive overlay target, in accordance with one or more embodiments of the present disclosure.
Figure 13A:
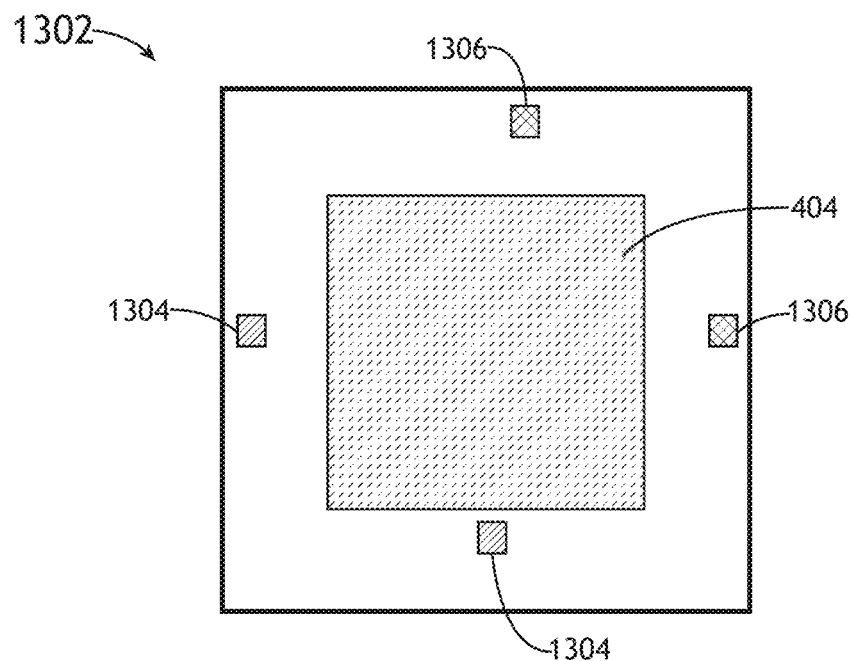
FIG. 13A is a top view of a pattern mask suitable for forming the first-layer features, in accordance with one or more embodiments of the present disclosure.
Figure 13B:
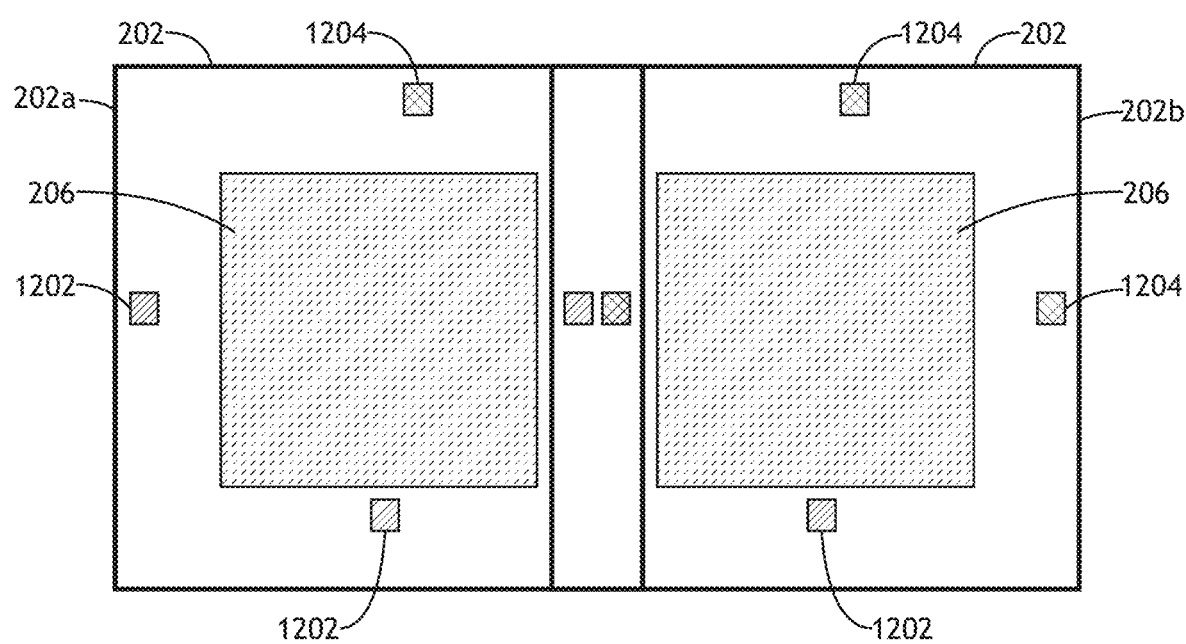
FIG. 13B is a top view of a portion of the sample illustrating the fabrication of the first-layer features of a field-sensitive overlay target based on the pattern mask in FIG. 13A with partially-overlapping exposure fields, in accordance with one or more embodiments of the present disclosure.
Figure 13C:
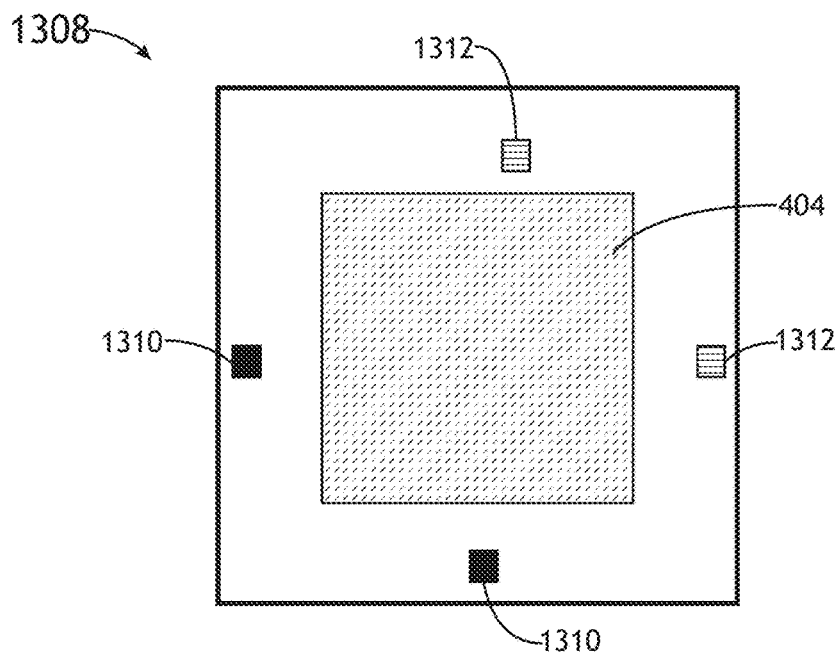
FIG. 13C is a top view of a pattern mask suitable for forming the second-layer features, in accordance with one or more embodiments of the present disclosure.
Figure 13D:
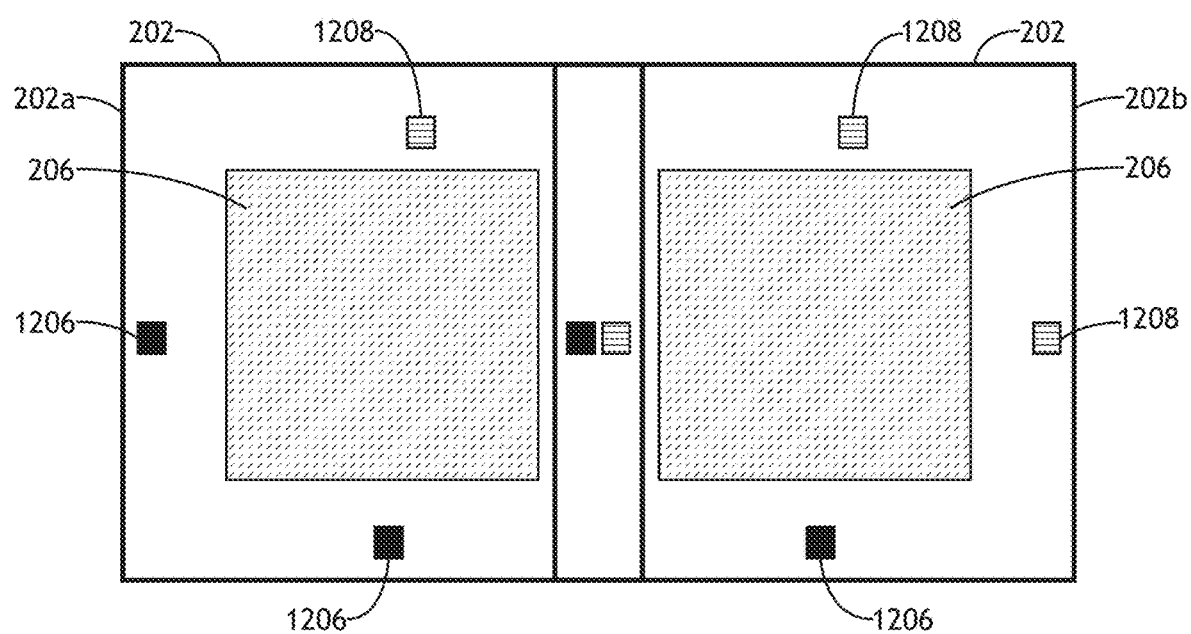
FIG. 13D is a top view of a portion of the sample illustrating the fabrication of the second-layer features of a field-sensitive overlay target based on the pattern mask in FIG. 13C with partially-overlapping exposure fields, in accordance with one or more embodiments of the present disclosure.
Figure 13E:
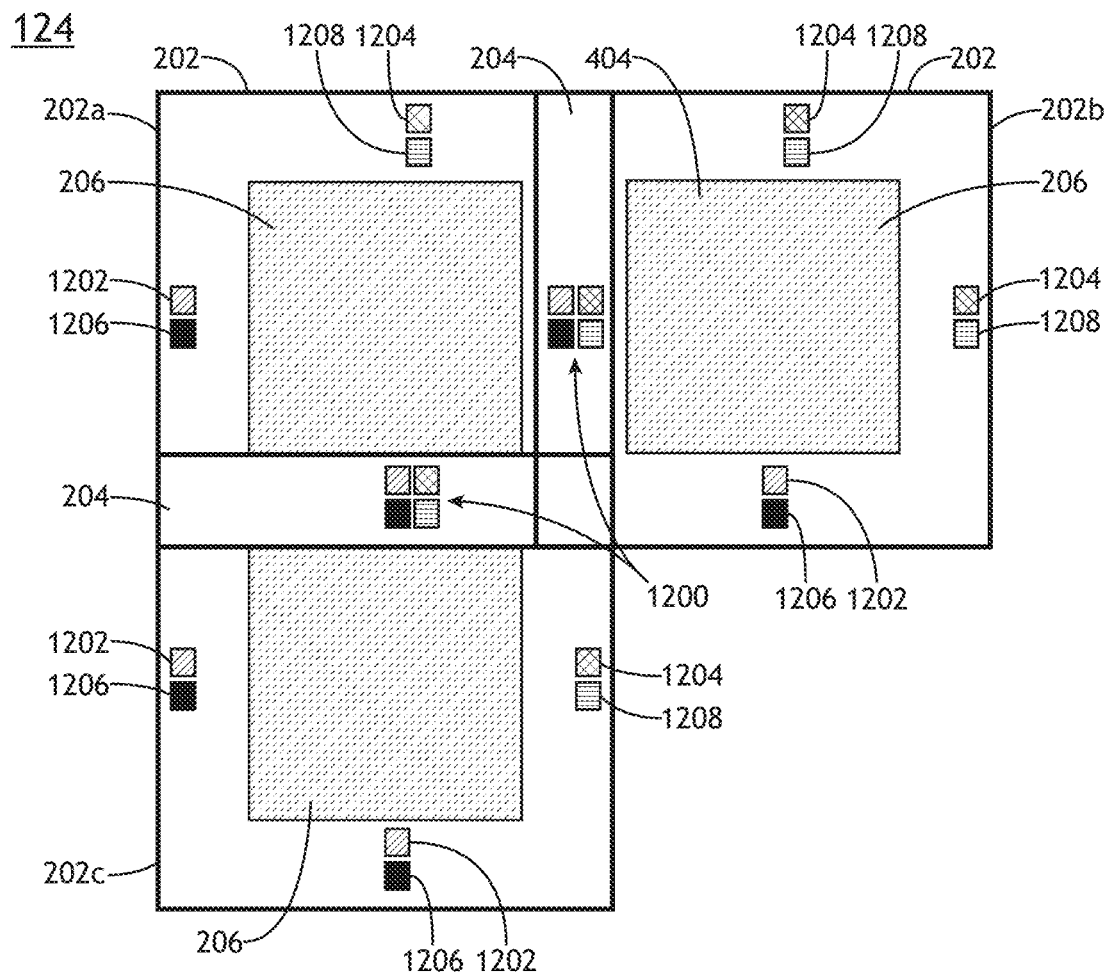
FIG. 13E is a top view of a portion of the sample illustrating the fabrication of the field-sensitive overlay targets based on the pattern mask in FIG. 9A along two orthogonal directions with partially-overlapping exposure fields, in accordance with one or more embodiments of the present disclosure.

Referring now to FIGS. 3 through 13E, field-sensitive metrology targets and their formation are described in greater detail in accordance with one or more embodiments of the present disclosure. It is contemplated herein that field-sensitive metrology targets may include features on any number of sample layers formed from any number of overlapping exposure fields 202. FIGS. 3 through 9B illustrate non-limiting examples of two-layer field-sensitive overlay targets in which features associated with a first sample layer are formed using one exposure field 202 and features associated with a second layer are formed using an adjacent overlapping exposure field 202. In these designs, relative positions and/or sizes of the first-layer features with respect to the second-layer features are sensitive to, among other things, field-to-field variations between lithography steps associated with different sample layers. FIGS. 10 through 11B illustrate a non-limiting example of a one-layer field-sensitive overlay target. In this design, relative positions and/or sizes of the first-layer features with respect to the second-layer features are sensitive to, among other things, field-to-field variations between lithography steps associated with a single sample layer. FIGS. 12 through 13E illustrate a non-limiting example of a two-layer field-sensitive overlay target formed using four exposures across two exposure fields 202: first-layer features are fabricated using adjacent exposure fields 202 in a manner similar to the illustration in FIGS. 10 through 11B, and second-layer features are fabricated using the same adjacent exposure fields 202 used for the first-layer features. In this design, portions of the target including features on different layers formed from fully overlapping exposure fields 202 may operate as traditional overlay targets and provide data indicative of errors in alignment and/or scaling of the lithography tool for successive exposures of the respective exposure field 202. Further, portions of the target including features formed from partially-overlapping exposure fields 202 may provide data indicative of field-to-field errors. Further, it is to be understood that the examples herein are provided solely for illustrative purposes and should not be interpreted as limiting. For example, additional designs of one or two-layer field-sensitive overlay targets providing traditional overlay and/or field-to-field data are within the spirit and scope of the present disclosure. By way of another example, field-sensitive overlay targets may include features on three or more sample layers formed with at least one exposure field 202 that only partially overlaps other exposure fields 202 at the target location.

Figure 3:
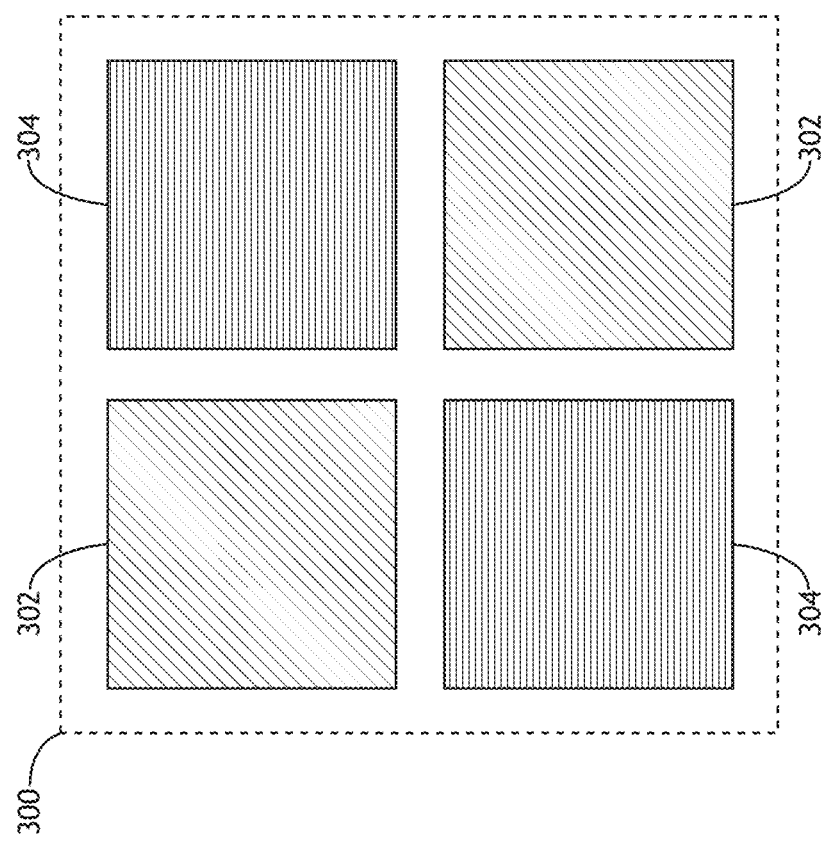
FIG. 3 is a conceptual top view of a two-layer field-sensitive overlay target, in accordance with one or more embodiments of the present disclosure.

FIG. 3 is a conceptual top view of a two-layer field-sensitive overlay target 300, in accordance with one or more embodiments of the present disclosure. In one embodiment, the field-sensitive overlay target 300 includes first-layer target features 302 formed with a first exposure field 202 and second-layer target features 304 formed with a second exposure field, where the second exposure field 202 only partially overlaps the first exposure field 202. For example, using the illustration of FIG. 2, the first-layer target features 302 may be associated with the exposure field 202a and the second-layer target features 304 may be associated with the exposure field 202b. The first-layer target features 302 and the second-layer target features 304 are thus complementary portions of the full field-sensitive overlay target 300.

It is to be understood that the layout of the field-sensitive overlay target 300 in FIG. 3 is intended to be illustrative rather than limiting. The first-layer target features 302 and the second-layer target features 304 may be arranged in any configuration suitable for an overlay measurement. For example, the layout of the first-layer target features 302 and the second-layer target features 304 is not limited to the depiction in FIG. 3 where the first-layer target features 302 and the second-layer target features 304 each include two cells and are distributed along crossed diagonals. Rather, the first-layer target features 302 and the second-layer target features 304 may distributed in any number of cells in any pattern suitable for overlay measurements. In one instance, the first-layer target features 302 and the second-layer target features 304 may fully or partially overlap. Further, any of the first-layer target features 302 or the second-layer target features 304 may be segmented along one or more directions.

Accordingly, it is further contemplated herein that any technique may be used to determine the relative positions of features formed from different exposures, which may be influenced by a variety of sources of error including overlay errors and field-to-field errors as described previously herein. For example, the positions of the first-layer target features 302 may be directly compared to the second-layer target features 304. By way of another example, centers of symmetry (e.g., rotational symmetry, reflective symmetry, or the like) associated with first-layer target features 302 and the second-layer target features 304 may be compared.

FIGS. 4A through 9B illustrate various designs of the field-sensitive overlay target 300 illustrated in FIG. 3, as well as associated pattern masks 120 suitable for fabricating the various designs using adjacent partially-overlapping exposure fields 202. It is to be understood, however, that the designs of the field-sensitive overlay target 300 illustrated in FIGS. 4A through 9B are provided solely for illustrative purposes and should not be interpreted as limiting. It is contemplated herein that any overlay target design may be adapted to be field-sensitive by fabricating complementary portions using adjacent partially-overlapping exposure fields 202.

Figure 4A:
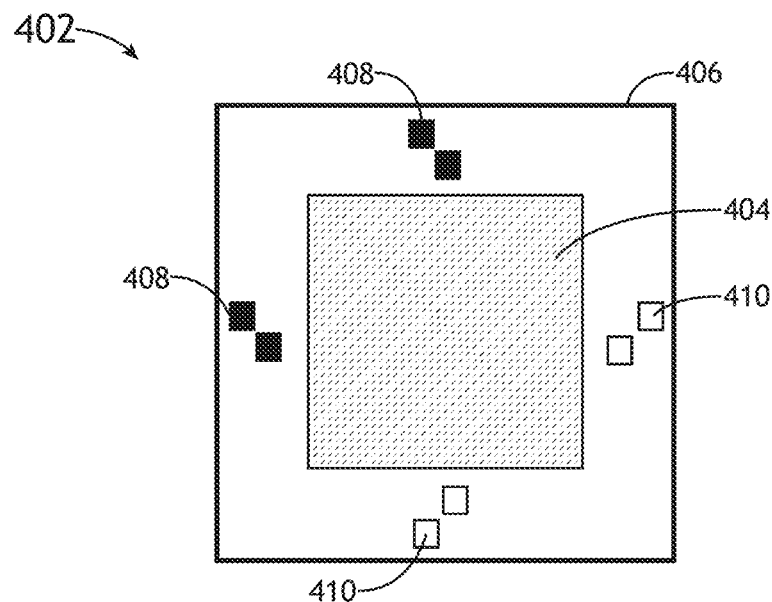
FIG. 4A is a top view of a pattern mask suitable for forming the field-sensitive overlay target illustrated in FIG. 3, in accordance with one or more embodiments of the present disclosure.

FIG. 4A is a top view of a pattern mask 402 (e.g., corresponding to the pattern mask 120 in FIG. 1B) suitable for forming the field-sensitive overlay target 300 illustrated in FIG. 3, in accordance with one or more embodiments of the present disclosure. In one embodiment, the pattern mask 402 includes a device area 404 including a pattern of device features (not shown) associated with a semiconductor device being fabricated. In another embodiment, the pattern mask 402 includes complementary portions of the field-sensitive overlay target 300 on opposing sides of the device area 404, but within a boundary 406 of an imaged area. For example, the pattern mask 402 includes complementary portions of the field-sensitive overlay target 300 along a horizontal axis for the formation of a full field-sensitive overlay target 300 with exposure fields 202 adjacent along the horizontal direction and also includes complementary portions of the field-sensitive overlay target 300 along a vertical axis for the formation of a full field-sensitive overlay target 300 with exposure fields 202 adjacent along the vertical direction. In particular, pattern elements 408 associated with the first-layer target features 302 are located on the left and top sides of the device area 404 and pattern elements 410 associated with the second-layer target features 304 are located on the right and bottom sides of the device area 404.

Figure 4B:
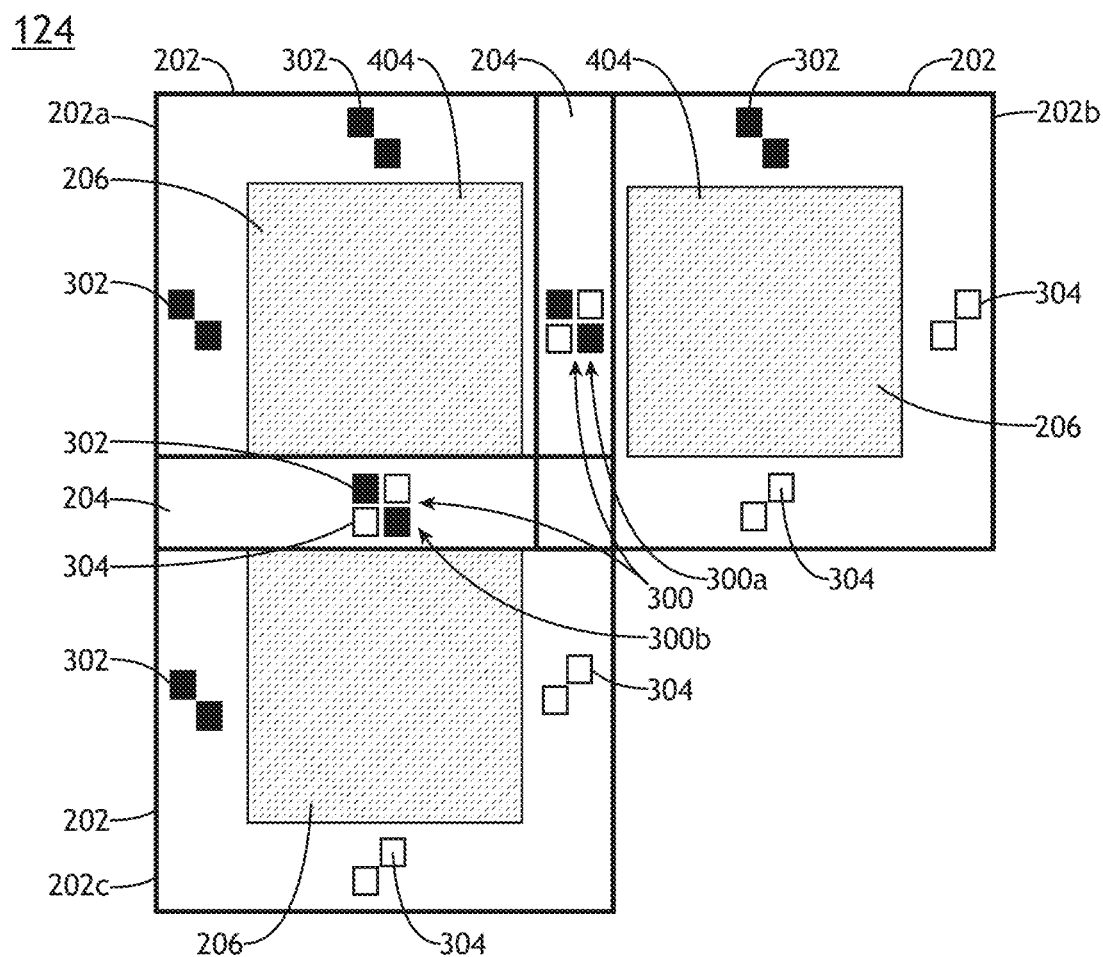
FIG. 4B is a top view of a portion of the sample illustrating the fabrication of field-sensitive overlay targets based on the pattern mask of FIG. 4A along two orthogonal directions with overlapping exposure fields, in accordance with one or more embodiments of the present disclosure.

FIG. 4B is a top view of a portion of the sample 124 illustrating the fabrication of field-sensitive overlay targets 300 based on the pattern mask 402 of FIG. 4A along two orthogonal directions with overlapping exposure fields 202, in accordance with one or more embodiments of the present disclosure. In one embodiment, each exposure field 202 includes an image of the pattern mask 402. Further, the spacing and amount of overlap between adjacent exposure fields 202 may be selected such that the complementary portions of the field-sensitive overlay target 300 overlap on the sample 124 to form the full field-sensitive overlay target 300 in an overlap region 204, whereas device features associated with the device area 404 of the pattern mask 402 are formed in non-overlap regions 206.

For example, the field-sensitive overlay target 300a is formed using first-layer target features 302 from a first exposure field 202 (e.g., exposure field 202a) and second-layer target features 304 from a second exposure field 202 (e.g., exposure field 202b). By way of another example, the field-sensitive overlay target 300b is formed using the first-layer target features 302 from the first exposure field 202 (e.g., exposure field 202a) and the second-layer target features 304 from a third exposure field 202 (e.g., exposure field 202c).

Referring now to FIGS. 5A through 9B, various designs of the field-sensitive overlay target, as well as the associated pattern masks, are described in greater detail, in accordance with one or more embodiments of the present disclosure. The descriptions associated with the pattern mask 402 and partially-overlapping exposures of the pattern mask 402 on the sample 124 to fabricate field-sensitive overlay targets 300 associated with FIGS. 4A and 4B may be applied to the target designs illustrated in FIGS. 5A through 9B.

Figure 5A:
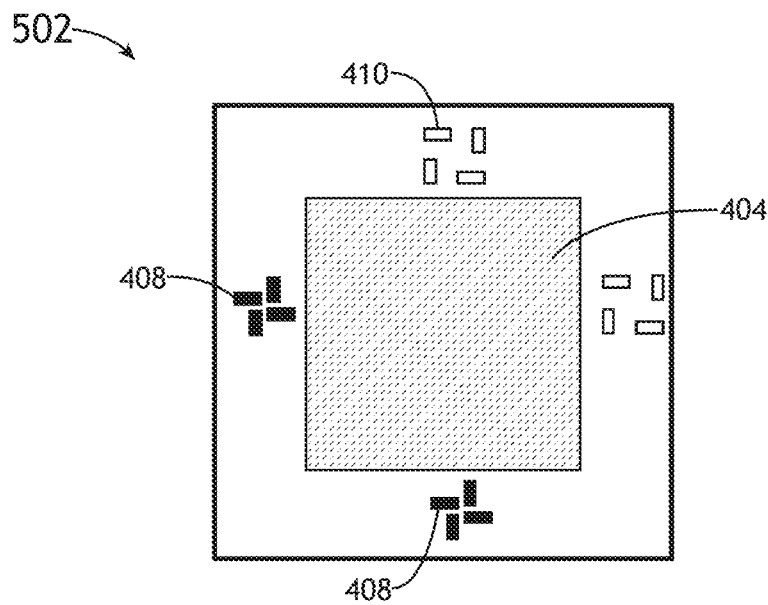
FIG. 5A is a top view of a pattern mask suitable for forming a design of the field-sensitive overlay target illustrated in FIG. 3 including four cells, where a portion of the first-layer target features and the second-layer target features are located in each cell, in accordance with one or more embodiments of the present disclosure.
Figure 5B:
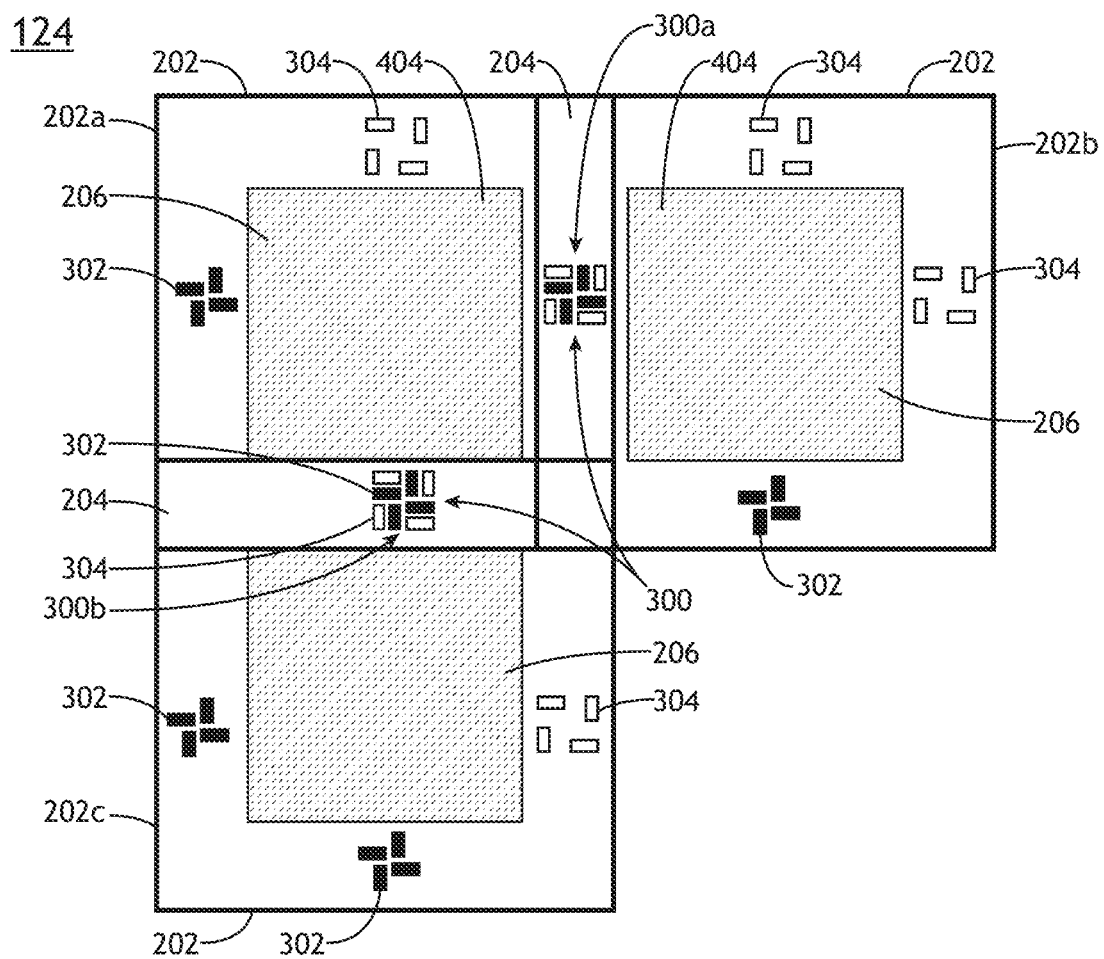
FIG. 5B is a top view of a portion of the sample illustrating the fabrication of the field-sensitive overlay targets based on the pattern mask in FIG. 5A along two orthogonal directions with partially-overlapping exposure fields, in accordance with one or more embodiments of the present disclosure.

FIG. 5A is a top view of a pattern mask 502 (e.g., corresponding to the pattern mask 120 in FIG. 1B) suitable for forming a design of the field-sensitive overlay target 300 illustrated in FIG. 3 including four cells, where a portion of the first-layer target features 302 and the second-layer target features 304 are located in each cell, in accordance with one or more embodiments of the present disclosure. In particular, pattern elements 408 associated with the first-layer target features 302 are located on the left and bottom sides of the device area 404 and pattern elements 410 associated with the second-layer target features 304 are located on the right and top sides of the device area 404. FIG. 5B is a top view of a portion of the sample 124 illustrating the fabrication of the field-sensitive overlay targets 300 based on the pattern mask 502 in FIG. 5A along two orthogonal directions with partially-overlapping exposure fields 202, in accordance with one or more embodiments of the present disclosure. The relative positions of the first-layer target features 302 and the second-layer target features 304 in this design may be, but are not required to be, determined by comparison of the respective centers of rotational symmetry. For example, the first-layer target features 302 and the second-layer target features 304 exhibit 90-degree rotational symmetry. However, it is contemplated herein that designs incorporating other types of symmetry including, but not limited to, 180-degree rotational symmetry or reflection symmetry are within the spirit and scope of the present disclosure.

Figure 6A:
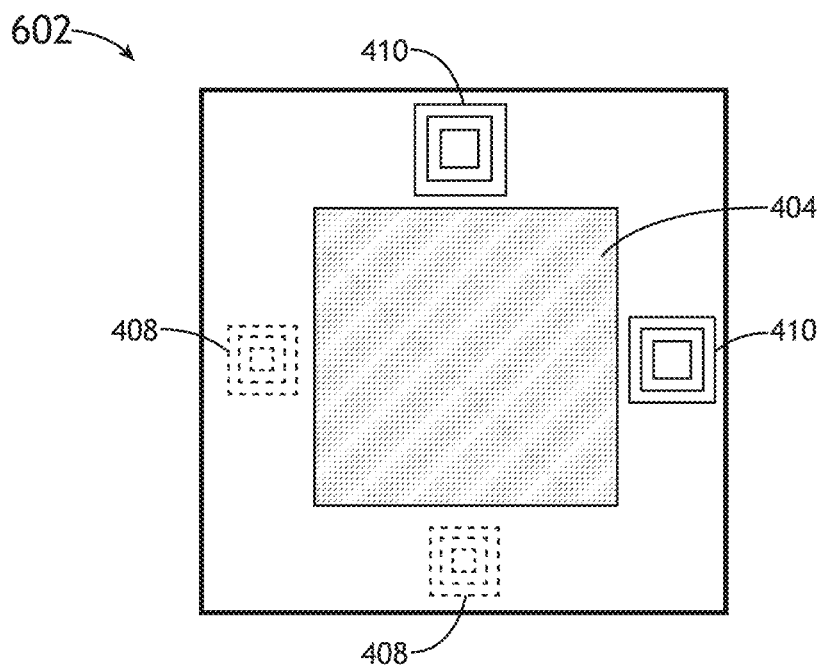
FIG. 6A is a top view of a pattern mask suitable for forming a box-in-box design of the field-sensitive overlay target illustrated in FIG. 3 in which portions of the first-layer target features and the second-layer target features are located in a series of nested boxes, in accordance with one or more embodiments of the present disclosure.
Figure 6B:
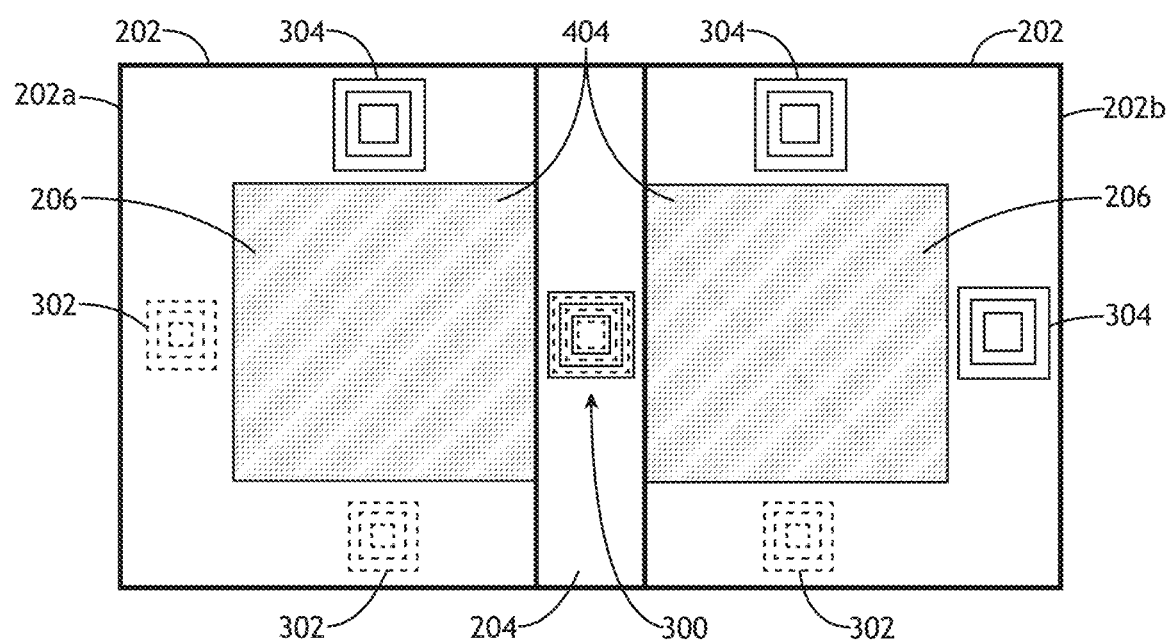
FIG. 6B is a top view of a portion of the sample illustrating the fabrication of the field-sensitive overlay targets based on the pattern mask in FIG. 6A with partially-overlapping exposure fields, in accordance with one or more embodiments of the present disclosure.

FIG. 6A is a top view of a pattern mask 602 (e.g., corresponding to the pattern mask 120 in FIG. 1B) suitable for forming a box-in-box design of the field-sensitive overlay target 300 illustrated in FIG. 3 in which portions of the first-layer target features 302 and the second-layer target features 304 are located in a series of nested boxes, in accordance with one or more embodiments of the present disclosure. FIG. 6B is a top view of a portion of the sample 124 illustrating the fabrication of the field-sensitive overlay targets 300 based on the pattern mask 602 in FIG. 6A with partially-overlapping exposure fields 202, in accordance with one or more embodiments of the present disclosure. Although not shown, a field-sensitive overlay target 300 may be formed through partially-overlapping exposures of the pattern mask 602 along the vertical direction in FIG. 6B in a similar manner is illustrated in FIGS. 4B and 5B.

Figure 7A:
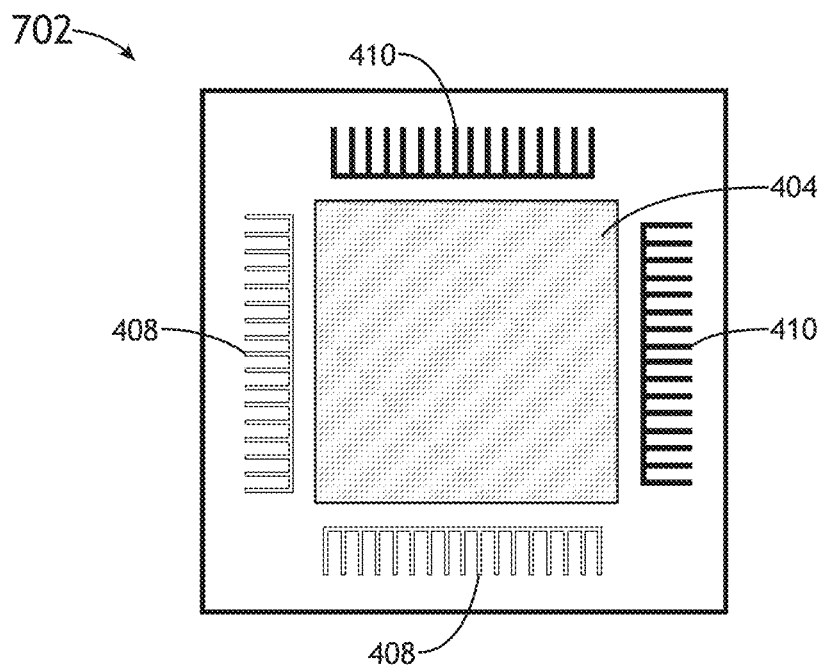
FIG. 7A is a top view of a pattern mask suitable for forming a "Ruller"-type design of the field-sensitive overlay target illustrated in FIG. 3 in which portions of the first-layer target features and the second-layer target features are located in a series of nested combs, in accordance with one or more embodiments of the present disclosure.
Figure 7B:
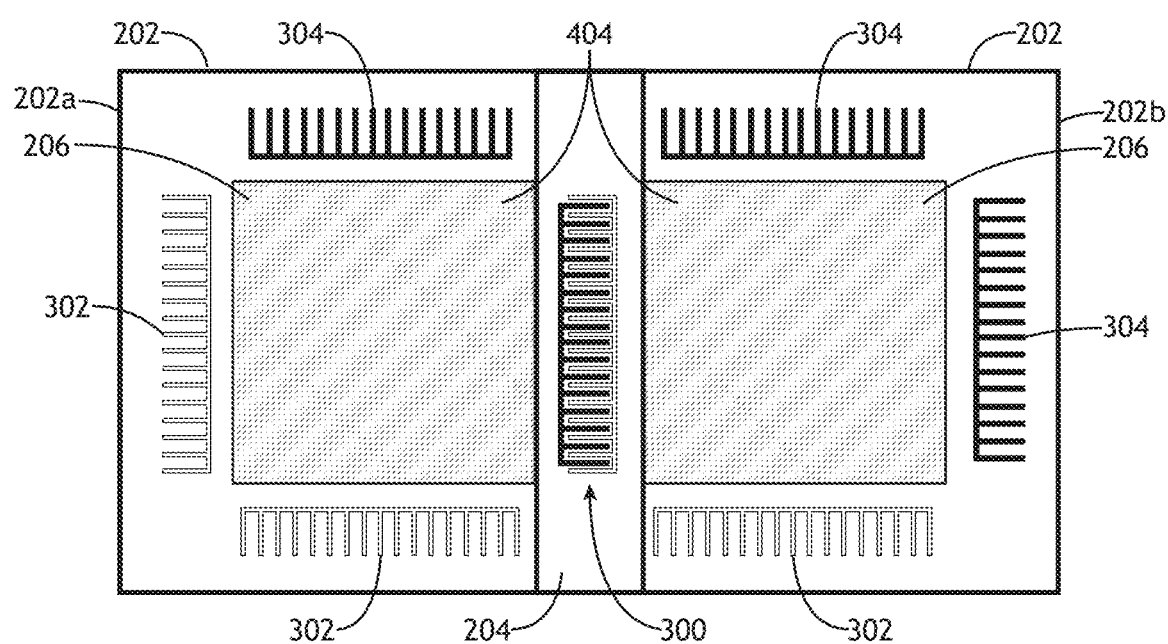
FIG. 7B is a top view of a portion of the sample illustrating the fabrication of the field-sensitive overlay targets based on the pattern mask in FIG. 7A with partially-overlapping exposure fields, in accordance with one or more embodiments of the present disclosure.

FIG. 7A is a top view of a pattern mask 702 (e.g., corresponding to the pattern mask 120 in FIG. 1B) suitable for forming a "Ruller"-type design of the field-sensitive overlay target 300 illustrated in FIG. 3 in which portions of the first-layer target features 302 and the second-layer target features 304 are located in a series of nested combs, in accordance with one or more embodiments of the present disclosure. FIG. 7B is a top view of a portion of the sample 124 illustrating the fabrication of the field-sensitive overlay targets 300 based on the pattern mask 702 in FIG. 7A with partially-overlapping exposure fields 202, in accordance with one or more embodiments of the present disclosure. Although not shown, a field-sensitive overlay target 300 may be formed through partially-overlapping exposures of the pattern mask 702 along the vertical direction in FIG. 7B in a similar manner is illustrated in FIGS. 4B and 5B.

FIG. 8A is a top view of a pattern mask 802 (e.g., corresponding to the pattern mask 120 in FIG. 1B) suitable for forming an AIMid design of the field-sensitive overlay target 300 illustrated in FIG. 3 in which the first-layer target features 302 and the second-layer target features 304 are interleaved, in accordance with one or more embodiments of the present disclosure. FIG. 8B is a top view of a portion of the sample 124 illustrating the fabrication of the field-sensitive overlay targets 300 based on the pattern mask 802 in FIG. 8A with partially-overlapping exposure fields 202, in accordance with one or more embodiments of the present disclosure. Although not shown, a field-sensitive overlay target 300 may be formed through partially-overlapping exposures of the pattern mask 802 along the vertical direction in FIG. 8B in a similar manner is illustrated in FIGS. 4B and 5B.

FIG. 9A is a top view of a pattern mask 902 (e.g., corresponding to the pattern mask 120 in FIG. 1B) suitable for forming an AIMid design of the field-sensitive overlay target 300 illustrated in FIG. 3 in which the first-layer target features 302 and the second-layer target features 304 overlap to form cross patterns, in accordance with one or more embodiments of the present disclosure. FIG. 9B is a top view of a portion of the sample 124 illustrating the fabrication of the field-sensitive overlay targets 300 based on the pattern mask 902 in FIG. 9A with partially-overlapping exposure fields 202, in accordance with one or more embodiments of the present disclosure. Although not shown, a field-sensitive overlay target 300 may be formed through partially-overlapping exposures of the pattern mask 902 along the vertical direction in FIG. 9B in a similar manner is illustrated in FIGS. 4B and 5B.

Referring now to FIGS. 10 through 11B, a single-layer field-sensitive overlay target 1000 is described in accordance with one or more embodiments of the present disclosure. FIG. 10 is a conceptual top view of a single-layer field-sensitive overlay target 1000, in accordance with one or more embodiments of the present disclosure. The single-layer field-sensitive overlay target 1000 in FIG. 10 is similar to the two-layer field-sensitive overlay target 300 illustrated in FIG. 3, except that all features are formed using exposure fields 202 associated with a common sample layer. In particular, the single-layer field-sensitive overlay target 1000 may include a first set of target features 1002 associated with a first exposure field 202 (e.g., exposure field 202*a*) and a second set of target features 1004 associated with a second exposure field 202 (e.g., exposure field 202*b* or exposure field 202*c*).

FIG. 11A is a top view of a pattern mask 1102 (e.g., corresponding to the pattern mask 120 in FIG. 1B) suitable for forming the field-sensitive overlay target 1000 illustrated in FIG. 10, in accordance with one or more embodiments of the present disclosure. In particular, pattern elements 1104 are associated with the first set of target features 1002 and pattern elements 1106 are associated with the second set of target features 1004. FIG. 11B is a top view of a portion of the sample 124 illustrating the fabrication of the field-sensitive overlay targets 1000 based on the pattern mask 1102 in FIG. 11A along two orthogonal directions with partially-overlapping exposure fields 202, in accordance with one or more embodiments of the present disclosure.

Referring now to FIGS. 12 through 13E, a two-layer field-sensitive overlay target 1200 is described in accordance with one or more embodiments of the present disclosure. FIG. 12 is a conceptual top view of a single-layer field-sensitive overlay target 1000, in accordance with one or more embodiments of the present disclosure.

In one embodiment, the field-sensitive overlay target 1200 is formed from four exposures. For example, the field-sensitive overlay target 1200 may include a first set of first-layer features 1202 formed from a first exposure field 202 (e.g., exposure field 202*a*) and a second set of first-layer features 1204 formed from a second exposure field 202 (e.g., exposure field 202*b* or exposure field 202*c*) that partially overlaps with the first exposure field 202. The field-sensitive overlay target 1200 may further include a first set of second-layer features 1206 formed from the first exposure field 202 (e.g., exposure field 202*a*) on the second sample layer and a second set of second-layer features 1208 formed from the second exposure field 202 (e.g., exposure field 202*b* or exposure field 202*c*).

FIG. 13A is a top view of a pattern mask 1302 (e.g., corresponding to the pattern mask 120 in FIG. 1B) suitable for forming the first-layer features (e.g., the first set of first-layer features 1202 and the second set of first-layer features 1204), in accordance with one or more embodiments of the present disclosure. In particular, pattern elements 1304 are associated with the first set of first-layer features 1202 and pattern elements 1306 are associated with the second set of first-layer features 1204.

FIG. 13B is a top view of a portion of the sample 124 illustrating the fabrication of the first-layer features of a field-sensitive overlay target 1200 based on the pattern mask 1302 in FIG. 13A with partially-overlapping exposure fields 202 (e.g., exposure fields 202*a,b* in a lithography step for the first layer), in accordance with one or more embodiments of the present disclosure.

FIG. 13C is a top view of a pattern mask 1308 (e.g., corresponding to the pattern mask 120 in FIG. 1B) suitable for forming the second-layer features (e.g., the first set of second-layer features 1206 and the second set of second-layer features 1208), in accordance with one or more embodiments of the present disclosure. In particular, pattern elements 1310 are associated with the first set of second-layer features 1206 and pattern elements 1312 are associated with the second set of second-layer features 1208.

FIG. 13D is a top view of a portion of the sample 124 illustrating the fabrication of the second-layer features of a field-sensitive overlay target 1200 based on the pattern mask 1308 in FIG. 13C with partially-overlapping exposure fields 202 (e.g., exposure fields 202*a,b* in a lithography step for the second layer), in accordance with one or more embodiments of the present disclosure. Further, the exposure fields 202*a,b* in a lithography step for the second layer may fully overlap the corresponding exposure fields 202*a,b* in a lithography step for the first layer.

FIG. 13E is a top view of a portion of the sample 124 illustrating the fabrication of the field-sensitive overlay targets 1200 based on the pattern masks 1302 and 1308 in FIGS. 13A and 13C along two orthogonal directions with partially-overlapping exposure fields 202, in accordance with one or more embodiments of the present disclosure.

As illustrated by FIGS. 12-13E, the field-sensitive overlay target 1200 may provide both typical overlay data and field-to-field data associated with each layer and between layers. For example, since the first set of first-layer features 1202 and the first set of second-layer features 1206 are formed from fully overlapping exposure fields 202 (e.g., exposure field 202*a*) in the first and second layers, the relative positions and/or sizes of the first set of first-layer features 1202 with respect to the first set of second-layer features 1206 may be indicative of typical overlay errors provided by typical overlay targets that are associated with aligning lithography steps across multiple layers. Also, the second set of first-layer features 1204 and the second set of second-layer features 1208 may provide similar data.

However, the field-sensitive overlay target 1200 may also provide data indicative of various field-to-field errors. For example, the pattern mask 1302 of FIG. 13A and the pattern mask 1308 of FIG. 13C both operate in a similar way as the pattern mask 1102 illustrated in FIG. 11A. Accordingly, the relative positions and/or sizes of the first set of first-layer features 1202 with respect to the second set of first-layer features 1204 may be indicative of field-to field errors in the first layer, while the relative positions and/or sizes of the first set of second-layer features 1206 with respect to the second set of second-layer features 1208 may be indicative of field-to field errors in the second layer. Further, the field-sensitive overlay target 1200 may provide data indicative of field-to-field errors spanning multiple layers. For example, the relative positions and/or sizes of the first set of first-layer features 1202 with respect to the second set of second-layer features 1208 may be indicative of field-to field errors spanning multiple layers similar to data provided by the targets illustrated in FIGS. 3-13E. Similar data may also be obtained based on the second set of first-layer features 1204 and the second set of second-layer features 1208.

As described previously herein, it is to be understood that FIGS. 3-13E are provided solely for illustrative purposes and should not be interpreted as limiting. Rather, a field-sensitive overlay target may include any number of features formed through any number of exposures, where at least some of the features of the target are formed from an exposure field 202 that only partially overlaps other exposure fields 202 used to form the target. Further, a field-sensitive overlay target may include a combination of features illustrated herein. For example, a field-sensitive overlay target may include features on three or more sample layers.

Figure 14:
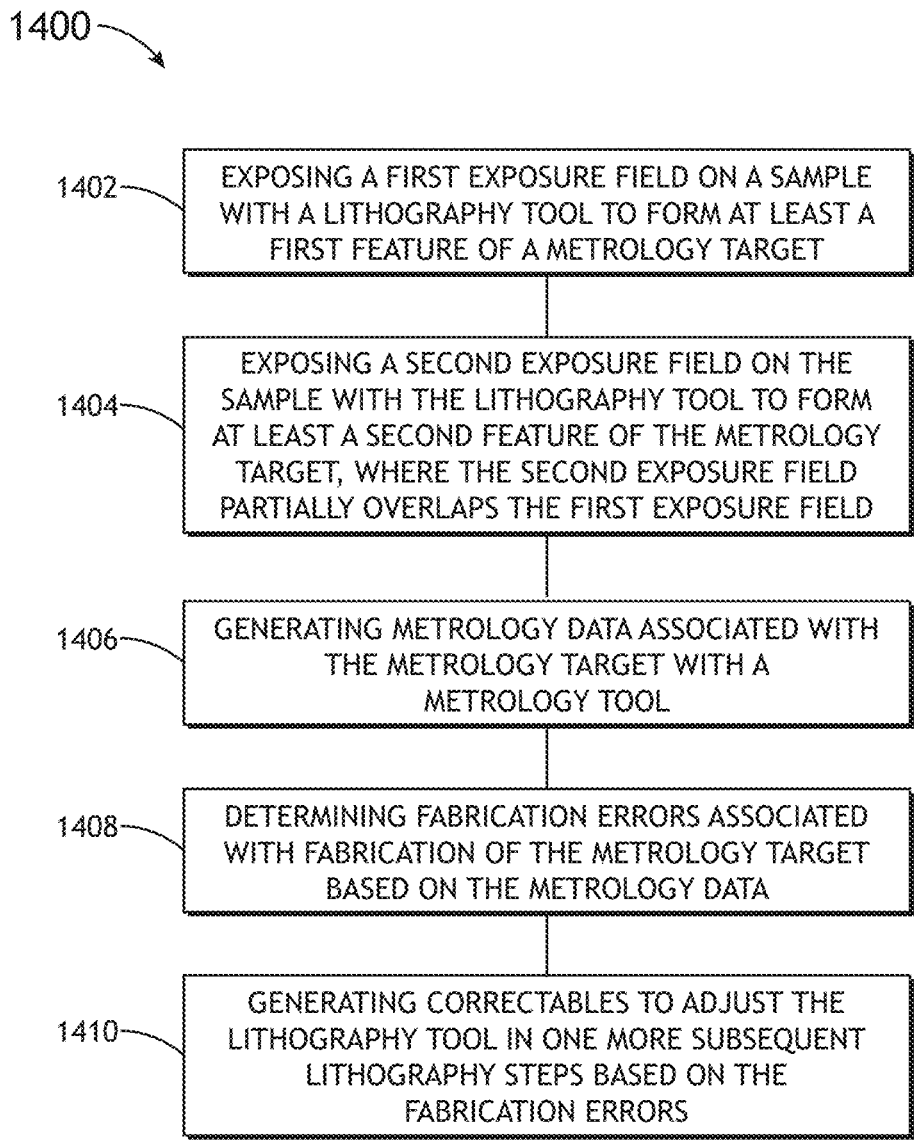
FIG. 14 is a flow diagram illustrating steps performed in a method for field-sensitive overlay metrology, in accordance with one or more embodiments of the present disclosure.

FIG. 14 is a flow diagram illustrating steps performed in a method 1400 for field-sensitive overlay metrology, in accordance with one or more embodiments of the present disclosure. Applicant notes that the embodiments and enabling technologies described previously herein in the context of the system 100 should be interpreted to extend to method 1400. It is further noted, however, that the method 1400 is not limited to the architecture of the system 100.

In one embodiment, the method includes a step 1402 of exposing a first exposure field on a sample with a lithography tool to form at least a first feature of a metrology target (e.g., a field-sensitive overlay target). In another embodiment, the method includes a step 1404 of exposing a second exposure field on the sample with the lithography tool to form at least a second feature of the metrology target, where the second exposure field partially overlaps the first exposure field. In particular the second exposure field may overlap the first exposure field at a location of the metrology target on the sample. In this regard, the first feature of the metrology target and the second feature of the metrology target may form complementary portions of the metrology target.

It is contemplated herein that the first exposure field may be on the same layer or on a different layer than the second exposure field. Accordingly, the first feature and the second feature may be on the same or different layers of the sample. Further, the method may include additional exposures to form additional features of the metrology target, where each additional exposure either fully or partially overlaps any other exposures used to generate features of the metrology target.

For example, FIGS. 3 through 13E illustrate various non-limiting examples of the implementation of the steps 1402 and 1404 using the system 100.

In another embodiment, the method includes a step 1406 of generating metrology data associated with the metrology target with a metrology tool (e.g., the metrology sub-system 104, or the like). In another embodiment, the method includes a step 1408 of determining one or more fabrication errors during fabrication of the metrology target based on the metrology data. For example, the relative positions and/or sizes of features of the metrology target (e.g., the first feature, the second feature, any additional features, or the like) may be indicative of fabrication errors during fabrication of the metrology target such as, but not limited to, errors associated with the lithography tool (e.g., field scaling errors, field-to-field alignment errors, sample-to-mask alignment errors, overlay errors, or the like) or errors associated with the sample (e.g., sample stresses, sample imperfections, or the like).

In another embodiment, the method includes a step 1410 of generating one or more correctables to adjust one or more fabrication parameters of the lithography tool in one more subsequent lithography steps based on the one or more fabrication errors.

The step 1410 may include generating correctables for use in any combination of feedback or feedforward control of the lithography tool used to fabricate the metrology target (and thus device features on the sample). For example, feed-forward correctables may be provided to the lithography tool during the exposure of subsequent layers of the same sample to compensate for measured variations on a current sample layer. By way of another example, feedback correctables may be provided to the lithography tool to mitigate variations (e.g., drifts) over time. Such correctables may be applied to different portions of the same sample, to different samples within the same lot, or samples spread across multiple lots.

It is contemplated herein that metrology targets generated by the method 1400 providing sensitivity to field-to-field errors (e.g., field-sensitive overlay targets) may enable the generation of more accurate and effective correctables to a lithography tool than typical overlay targets. For example, the field-sensitive metrology targets disclosed herein may facilitate determination of high-resolution reference points (HRRP) for the reduction of overlay errors between stitched target cells that originate from different exposure fields. By way of another example, the field-sensitive metrology targets disclosed herein may be printed along field edges to facilitate intra-and inter-field patterning wrap geometry measurements (PWG) or assist in fine-tuning or verification of existing PWG techniques.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
a controller communicatively coupled to a metrology tool, the controller including one or more processors configured to execute program instructions causing the one or more processors to:
receive a metrology target design, wherein the metrology target design includes at least a first feature formed by exposing a first exposure field on a first layer of a sample with a lithography tool, wherein the metrology target design further includes at least a second feature formed by exposing a second exposure field on a second layer of the sample different than the first layer with the lithography tool, wherein the second exposure field partially overlaps the first exposure field, wherein the second exposure field overlaps the first exposure field at a location of a metrology target on the sample;
receive metrology data associated with the metrology target fabricated according to the metrology target design;
determine one or more fabrication errors during fabrication of the metrology target based on the metrology data; and
generate one or more correctables to adjust one or more fabrication parameters of the lithography tool in one or more subsequent lithography steps based on the one or more fabrication errors.

2. The metrology system of claim 1, wherein the one or more fabrication errors include errors associated with the lithography tool.

3. The metrology system of claim 2, wherein the one or more fabrication errors include at least one of field scaling errors, field-to-field alignment errors, sample-to-mask alignment errors, or overlay errors.

4. The metrology system of claim 1, wherein the one or more fabrication errors include errors associated with the sample.

5. The metrology system of claim 4, wherein the one or more fabrication errors include at least one of field sample stresses or sample imperfections.

6. The metrology system of claim 1, wherein the metrology tool comprises:
an image-based metrology tool.

7. The metrology system of claim 6, wherein the metrology target design comprises:
a design of at least one of an advanced imaging metrology (AIM) target, an AIM in-die target, a multilayer AIM in-die target, a box-in-box target, or a "Ruller" target.

8. The metrology system of claim 1, wherein the metrology tool comprises:
a scatterometry-based metrology tool.

9. The metrology system of claim 8, wherein the metrology target comprises:
a scatterometry metrology target.

10. The metrology system of claim 1, wherein the metrology target is symmetric to rotation around at least one of 90 degrees or 180 degrees.

11. The metrology system of claim 1, wherein the metrology target is reflection symmetric about at least one axis.

12. The metrology system of claim 1, wherein the metrology target design further includes at least a third feature formed by exposing a third exposure field on the first layer of the sample with the lithography tool, wherein the third exposure field partially overlaps the first exposure field on the first layer of the sample and fully overlaps the second exposure field on the second layer of the sample, wherein the metrology target design further includes at least a fourth feature formed by exposing a fourth exposure field on the second layer of the sample with the lithography tool, wherein the fourth exposure field partially overlaps the first exposure field on the first layer of the sample and fully overlaps the second exposure field on the second layer of the sample.

13. The metrology system of claim 12, wherein the one or more fabrication errors include overlay errors based on at least one of a position of the first feature with respect to the third feature or a position of the second feature with respect to the fourth feature, wherein the one or more fabrication errors further include field-to-field errors based on at least one of a position of the first feature with respect to the fourth feature or a position of the second feature with respect to the third feature.

* * * * *